US012610698B2

(12) United States Patent
Choi et al.

(10) Patent No.: US 12,610,698 B2
(45) Date of Patent: Apr. 21, 2026

(54) DISPLAY APPARATUS

(71) Applicant: SAMSUNG DISPLAY CO., LTD.,
Yongin-si (KR)

(72) Inventors: Jonghyun Choi, Yongin-si (KR);
Younjoon Kim, Yongin-si (KR); **Jinho
Ju,** Yongin-si (KR)

(73) Assignee: SAMSUNG DISPLAY CO., LTD.,
Gyeonggi-Do (KR)

( * ) Notice: Subject to any disclaimer, the term of this
patent is extended or adjusted under 35
U.S.C. 154(b) by 351 days.

(21) Appl. No.: 18/112,195

(22) Filed: Feb. 21, 2023

(65) Prior Publication Data

US 2023/0371318 A1     Nov. 16, 2023

(30) Foreign Application Priority Data

May 16, 2022   (KR) ........................ 10-2022-0059838
Jul. 29, 2022   (KR) ........................ 10-2022-0095028

(51) Int. Cl.
H10K 59/124      (2023.01)
H10K 59/122      (2023.01)
*H10K 102/00*      (2023.01)

(52) U.S. Cl.
CPC ......... H10K 59/124 (2023.02); H10K 59/122
(2023.02); *H10K 2102/311* (2023.02)

(58) Field of Classification Search
CPC ........... H01K 2102/311; H10K 59/122; H10K
59/353; H10K 77/111
See application file for complete search history.

(56) References Cited

U.S. PATENT DOCUMENTS

| | | | |
|---|---|---|---|
| 9,449,840 B1 * | 9/2016 | Ban ..................... H01L 21/0276 |
| 10,225,936 B2 | 3/2019 | Yang et al. |
| 10,326,096 B2 | 6/2019 | Kato et al. |
| 11,309,363 B2 | 4/2022 | Zhao |
| 11,349,104 B2 * | 5/2022 | Bu ....................... H10D 86/451 |
| 2016/0218162 A1 | 7/2016 | Kang et al. |
| 2016/0260719 A1 * | 9/2016 | Chung .............. H10D 30/0245 |
| 2017/0097535 A1 | 4/2017 | Andou et al. |
| 2019/0148476 A1 | 5/2019 | Park et al. |
| 2019/0278145 A1 | 9/2019 | Tanaka et al. |
| 2021/0020723 A1 | 1/2021 | Park et al. |
| 2021/0202633 A1 | 7/2021 | Song et al. |

(Continued)

FOREIGN PATENT DOCUMENTS

| | | |
|---|---|---|
| CN | 109494313 A | 3/2019 |
| CN | 110491910 A | 11/2019 |

(Continued)

*Primary Examiner* — Walter L Lindsay, Jr.
(74) *Attorney, Agent, or Firm* — CANTOR COLBURN
LLP

(57) ABSTRACT

A display apparatus includes a substrate including a plurality
of first pixel areas arranged at a first pitch and a plurality of
second pixel areas arranged at a second pitch, a first insu-
lating layer disposed on the substrate and defining a plurality
of first trenches therein corresponding to boundaries among
the plurality of first pixel areas, respectively, and a plurality
of second trenches corresponding to boundaries among the
plurality of second pixel areas, respectively, a plurality of
first pixel separation films buried in the plurality of first
trenches, respectively, and a plurality of second pixel sepa-
ration films buried in the plurality of second trenches,
respectively.

23 Claims, 22 Drawing Sheets

(56) References Cited

U.S. PATENT DOCUMENTS

| | | | |
|---|---|---|---|
| 2022/0093705 A1* | 3/2022 | Kim | H10K 59/126 |
| 2022/0102583 A1* | 3/2022 | Baumheinrich | G02B 6/12007 |
| 2023/0128710 A1* | 4/2023 | Choi | H10K 59/1216 |
| | | | 257/40 |
| 2023/0371318 A1* | 11/2023 | Choi | H10K 59/124 |

FOREIGN PATENT DOCUMENTS

| | | | |
|---|---|---|---|
| KR | 1020120095019 A | 8/2011 | |
| KR | 1020160090979 A | 8/2016 | |
| KR | 1020170095948 A | 8/2017 | |
| KR | 1020200085962 A | 7/2020 | |
| KR | 1020210010717 A | 1/2021 | |

* cited by examiner

DISPLAY APPARATUS

This application claims priority to Korean Patent Application No. 10-2022-0059838, filed on May 16, 2022, and Korean Patent Application No. 10-2022-0095028, filed on Jul. 29, 2022, and all the benefits accruing therefrom under 35 U.S.C. § 119, the contents of which in their entirety are herein incorporated by reference.

BACKGROUND

1. Field

One or more embodiments relate to display apparatuses.

2. Description of the Related Art

The use of a display apparatus has been diversified. Furthermore, it is a trend that the thickness and weight of the display apparatus decrease, and thus the scope of a use thereof has been broadened.

As the display apparatus is widely used, there may be various methods of designing the shape of the display apparatus. Furthermore, as the area of a display area of the display apparatus increases, various functions combined or linked to the display apparatus have been added.

SUMMARY

One or more embodiments include high-resolution display apparatuses which may be robust and simultaneously flexible against external impacts.

The technical aspects to be achieved by the disclosure are not limited to the above, and other technical aspects that are not mentioned herein would be clearly understood by a person skilled in the art from the description of the present invention.

Additional aspects will be set forth in part in the description which follows and, in part, will be apparent from the description, or may be learned by practice of the presented embodiments of the disclosure.

According to an aspect of the disclosure, a display apparatus includes: a substrate in which a first area and a second area are defined, where the first area includes a plurality of first pixel areas arranged at a first pitch in a first direction, and the second area includes a plurality of second pixel areas arranged at a second pitch less than the first pitch in the first direction; a first insulating layer disposed on the substrate and defining a plurality of first trenches and a plurality of second trenches therein, where the plurality of first trenches correspond to boundaries among the plurality of first pixel areas, respectively, and are arranged in the first direction, and the plurality of second trenches correspond to boundaries among the plurality of second pixel areas, respectively, and are arranged in the first direction; a plurality of first pixel separation films buried in the plurality of first trenches, respectively, and including a material different from the first insulating layer; and a plurality of second pixel separation films buried in the plurality of second trenches, respectively, and including a material different from the first insulating layer.

According to an embodiment, a first thickness of each of the plurality of first pixel separation films along a thickness direction of the substrate may be greater than a second thickness of each of the plurality of second pixel separation films along the thickness direction of the substrate.

According to an embodiment, the first area and the second area may each be provided in plurality, and the plurality of first areas and the plurality of second areas may be alternately arranged with each other in the first direction.

According to an embodiment, the display apparatus may further include a plurality of first pixel circuits arranged in some second pixel areas, respectively, among the plurality of second pixel areas, a plurality of second pixel circuits arranged in some other second pixel areas, respectively, among the plurality of second pixel areas, a plurality of first display elements arranged in the first area and electrically connected to the plurality of first pixel circuits, respectively, and a plurality of second display elements arranged in the second area and electrically connected to the plurality of second pixel circuits, respectively.

According to an embodiment, a first gap between first display elements neighboring each other in the first direction among the plurality of first display elements may be substantially the same as a second gap between second display elements neighboring each other in the first direction among the plurality of second display elements.

According to an embodiment, the display apparatus may further include a plurality of conductive patterns provided between the substrate and the plurality of first pixel separation films, and contacting the plurality of first pixel separation films, respectively.

According to an embodiment, the display apparatus may further include a plurality of semiconductor patterns provided between the substrate and the plurality of first pixel separation films, and contacting the plurality of first pixel separation films, respectively.

According to an embodiment, a first thickness of each of the plurality of first pixel separation films along a thickness direction of the substrate may be substantially the same as a second thickness of each of the plurality of second pixel separation films along the thickness direction of the substrate.

According to an embodiment, the display apparatus may further include a plurality of first pixel circuits arranged in the plurality of first pixel areas, respectively, a plurality of second pixel circuits arranged in the plurality of second pixel areas, respectively, a plurality of first display elements arranged in the first area and respectively and electrically connected to the plurality of first pixel circuits, and a plurality of second display elements arranged in the second area and electrically connected to the plurality of second pixel circuits, respectively, and a first gap between first display elements neighboring each other in the first direction among the plurality of first display elements may be substantially the same as a second gap between second display elements neighboring each other in the first direction among the plurality of second display elements.

According to an embodiment, a folding area including the first area and the second area, and a non-folding area, may be further defined in the substrate, and the display apparatus may further include a support layer disposed below the substrate and including a first support portion and a second support portion, the first support portion including a slit corresponding to the first area of the folding area and a rib corresponding to the second area of the folding area, and the second support portion corresponding to the non-folding area.

According to an embodiment, the non-folding area may include a plurality of third pixel areas arranged in the first direction at a third pitch that is substantially the same as the first pitch, the first insulating layer may further define a plurality of third trenches therein corresponding to boundaries among the plurality of third pixel areas, respectively, and arranged in the first direction, and the display apparatus may further include a plurality of third pixel separation films buried in the plurality of third trenches, respectively, and including a material different from the first insulating layer.

According to an embodiment, a first thickness of each of the plurality of first pixel separation films along a thickness direction of the substrate may be greater than each of a second thickness of each of the plurality of second pixel separation films along the thickness direction of the substrate and a third thickness of each of the plurality of third pixel separation films along the thickness direction of the substrate.

According to an embodiment, the display apparatus may further include a plurality of first pixel circuits arranged in some second pixel areas, respectively, among the plurality of second pixel areas, a plurality of second pixel circuits arranged in some other second pixel areas, respectively, among the plurality of second pixel areas, a plurality of third pixel circuits arranged in the plurality of third pixel areas, respectively, a plurality of first display elements arranged in the first area of the folding area and electrically connected to the plurality of first pixel circuits, respectively, a plurality of second display elements arranged in the second area of the folding area and electrically connected to the plurality of second pixel circuits, respectively, and a plurality of third display elements arranged in the non-folding area and electrically connected to the plurality of third pixel circuits, respectively, where a first gap between first display elements neighboring each other in the first direction among the plurality of first display elements may be substantially the same as each of a second gap between second display elements neighboring each other in the first direction among the plurality of second display elements and a third gap between the third display elements neighboring each other in the first direction among the plurality of third display elements.

According to an embodiment, a first gap between the first pixel separation films neighboring each other in the first direction among the plurality of first pixel separation films may be greater than a second gap between the second pixel separation films neighboring each other in the first direction among the plurality of second pixel separation films.

According to an embodiment, the first insulating layer may include an inorganic material, and the plurality of first pixel separation films and the plurality of second pixel separation films may each include an organic material.

According to an embodiment, the display apparatus may further include a conductive layer disposed on the first insulating layer, and a second insulating layer disposed on the conductive layer and monolithic with the plurality of first pixel separation films and the plurality of second pixel separation films.

According to an embodiment, the plurality of first pixel areas may be arranged in a second direction crossing the first direction at a third pitch, and the plurality of second pixel areas may be arranged in the second direction at a fourth pitch substantially the same as the third pitch.

According to another aspect of the disclosure, a display apparatus includes: a substrate in which a first area including a plurality of first pixel areas and a second area including a plurality of second pixel areas are defined, an insulating layer disposed on the substrate and defining a plurality of first trenches and a plurality of second trenches therein, the plurality of first trenches respectively and at least partially surrounding the plurality of first pixel areas, and the plurality of second trenches at least partially surrounding the plurality of second pixel areas, respectively, a plurality of first pixel separation films buried in the plurality of first trenches, respectively, and comprising a material different from the insulating layer, and a plurality of second pixel separation films buried in the plurality of second trenches, respectively, and comprising a material different from the insulating layer, where a first depth of each of the plurality of first pixel separation films along a thickness direction of the substrate is greater than a second depth of each of the plurality of second pixel separation films along the thickness direction of the substrate.

According to an embodiment, the display apparatus may further include a plurality of first pixel circuits arranged in some second pixel areas, respectively, among the plurality of second pixel areas, a plurality of second pixel circuits arranged in some other second pixel areas, respectively, among the plurality of second pixel areas, a plurality of first display elements arranged in the first area and electrically connected to the plurality of first pixel circuits, respectively, and a plurality of second display elements arranged in the second area and electrically connected to the plurality of second pixel circuits, respectively.

According to an embodiment, a first gap between the first display elements neighboring each other among the plurality of first display elements may be substantially the same as a second gap between the second display elements neighboring each other among the second display elements.

According to an embodiment, the display apparatus may further include a plurality of conductive patterns or a plurality of semiconductor patterns provided between the substrate and the plurality of first pixel separation films and contacting the plurality of first pixel separation films, respectively.

According to an embodiment, the first area and the second area may each be provided in plurality, and the plurality of first areas and the plurality of second areas may be alternately arranged with each other in one direction.

According to an embodiment, a folding area including the first area and the second area, and a non-folding area, may be further defined in the substrate, and the display apparatus may further include a support layer disposed below the substrate and comprising a first support portion comprising a slit corresponding to the first area of the folding area and a rib corresponding to the second area of the folding area, and a second support portion corresponding to the non-folding area.

According to an embodiment, the non-folding area may include a plurality of third pixel areas, the insulating layer may further define a plurality of third trenches therein at least partially surrounding the plurality of third pixel areas, respectively, and the display apparatus may further include a plurality of third pixel separation films buried in the plurality of third trenches, respectively, and comprising a material different from the insulating layer, wherein the first depth of each of the plurality of first pixel separation films is greater than a third depth of each of the plurality of third pixel separation films along the thickness direction of the substrate.

According to an embodiment, the insulating layer may include an inorganic material, and the plurality of first pixel separation films and the plurality of second pixel separation films may each include an organic material.

Other aspects, features, and advantages than those described above will become apparent from the following drawings, claims, and detailed description of the disclosure.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 19 is an exemplary cross-sectional view of a portion of the display apparatus of FIG. 18 taken along line IX-IX';

FIG. 21 is still another exemplary cross-sectional view of a portion of the display apparatus of FIG. 18 taken along line IX-IX';

FIG. 22 is yet another exemplary cross-sectional view of a portion of the display apparatus of FIG. 18 taken along line IX-IX'; and

6

Figure 18:
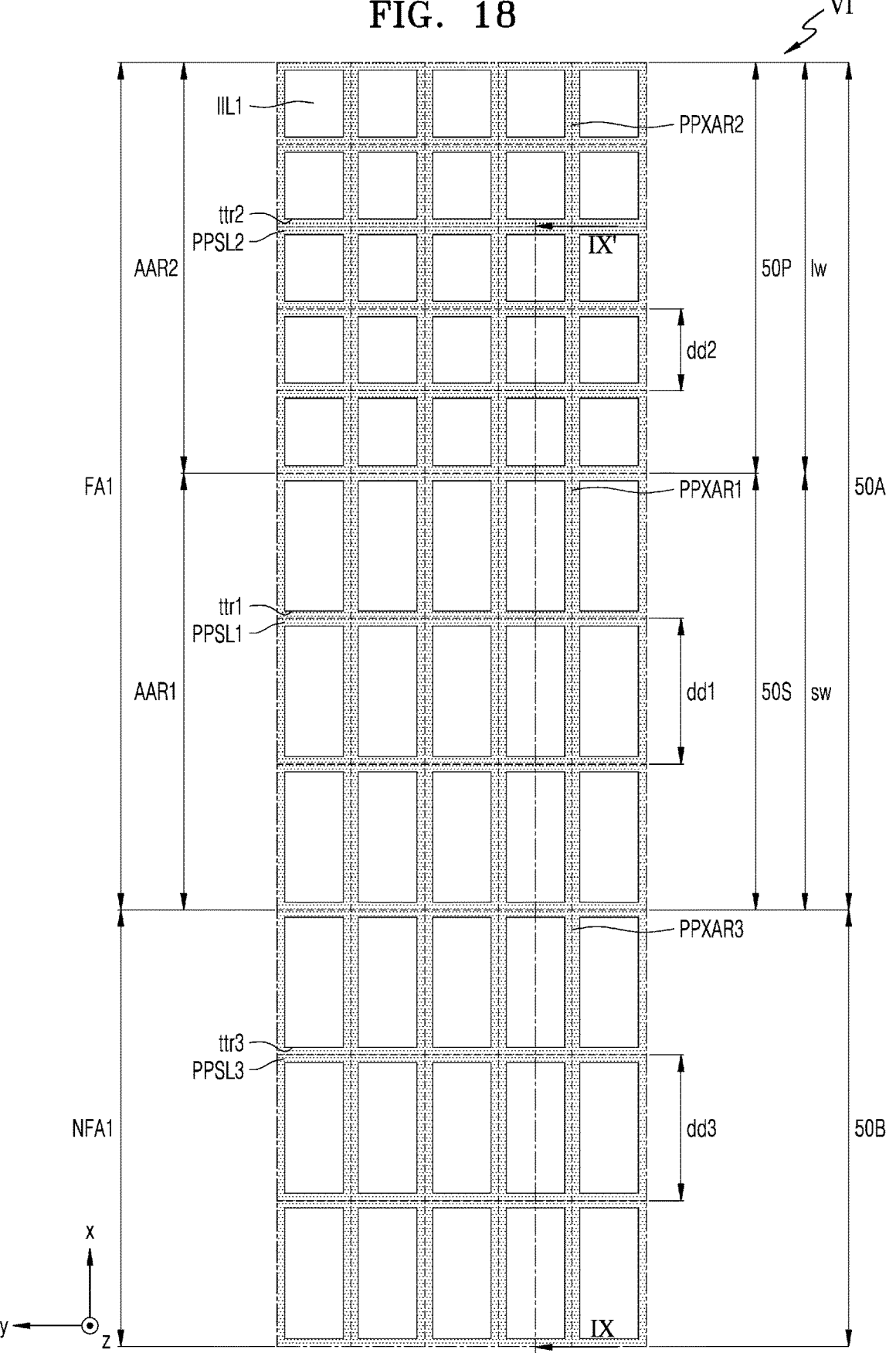
FIG. 18 is an exemplary enlarged plan view of the region VI of FIG. 8.
Figure 23:
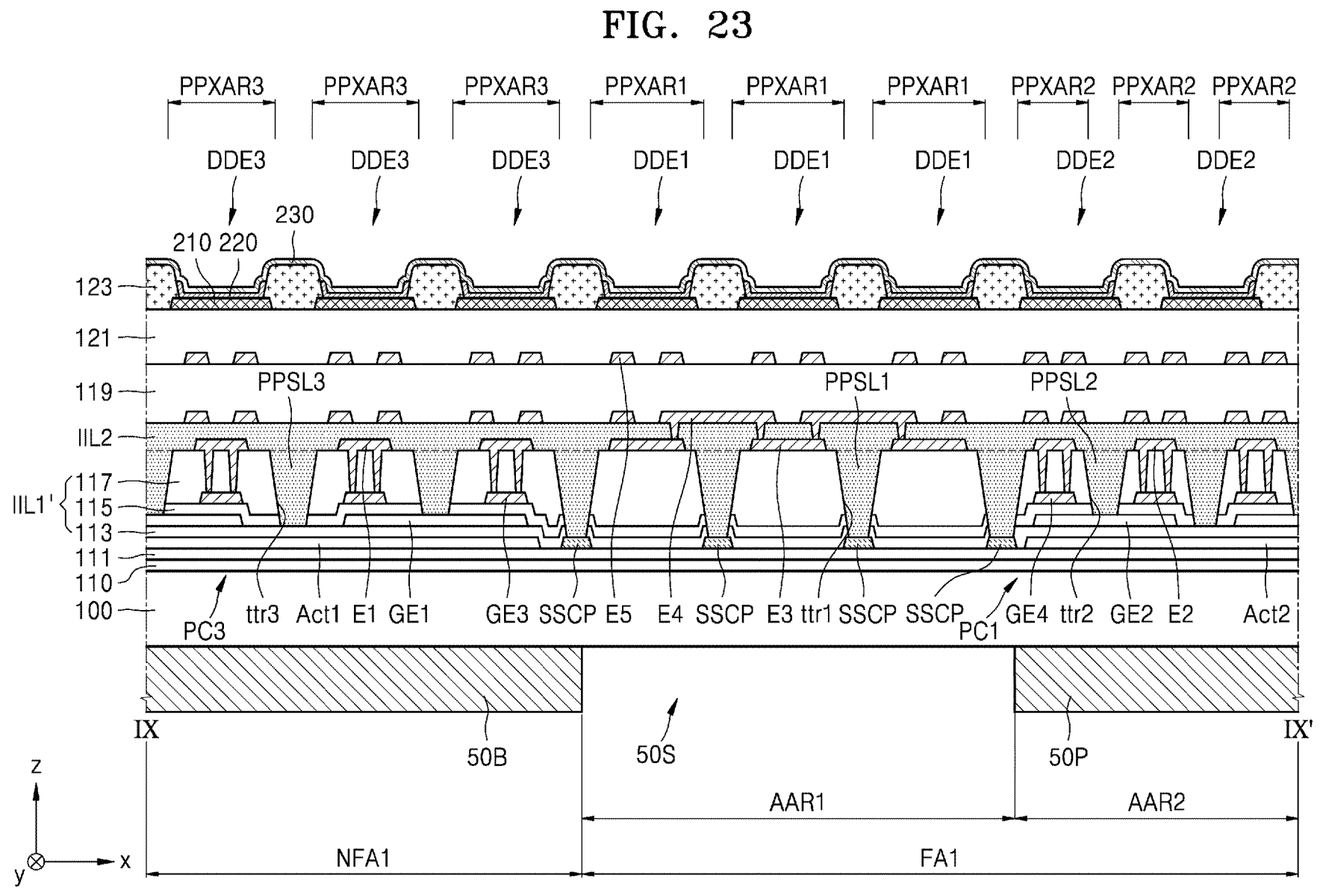

FIG. 23 is another exemplary cross-sectional view of a portion of the display apparatus of FIG. 18 taken along line IX-IX'.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

"About" "substantially the same" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially the same" can mean within one or more standard deviations, or within ±30%, 20%, 10% or 5% of the stated value. Hereinafter, exemplary embodiments will be described in detail with reference to the accompanying drawings, and in the description with reference to the drawings, the same or corresponding constituents are indicated by the same reference numerals and redundant descriptions thereof are omitted.

In the embodiments below, it will be understood that although the terms "first," "second," etc. may be used herein to describe various components, these components should not be limited by these terms. These terms are only used to distinguish one component from another.

In the embodiments below, as used herein, the singular forms are intended to include the plural forms as well, unless the context clearly indicates otherwise.

In the embodiments below, it will be further understood that the terms "comprises" and/or "comprising" used herein specify the presence of stated features or components, but do not preclude the presence or addition of one or more other features or components.

In the embodiments below, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the expression such as "A and/or B" may include A, B, or A and B. Furthermore, the expression such as "at least one of A and B" may include A, B, or A and B.

In the embodiments below, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1:
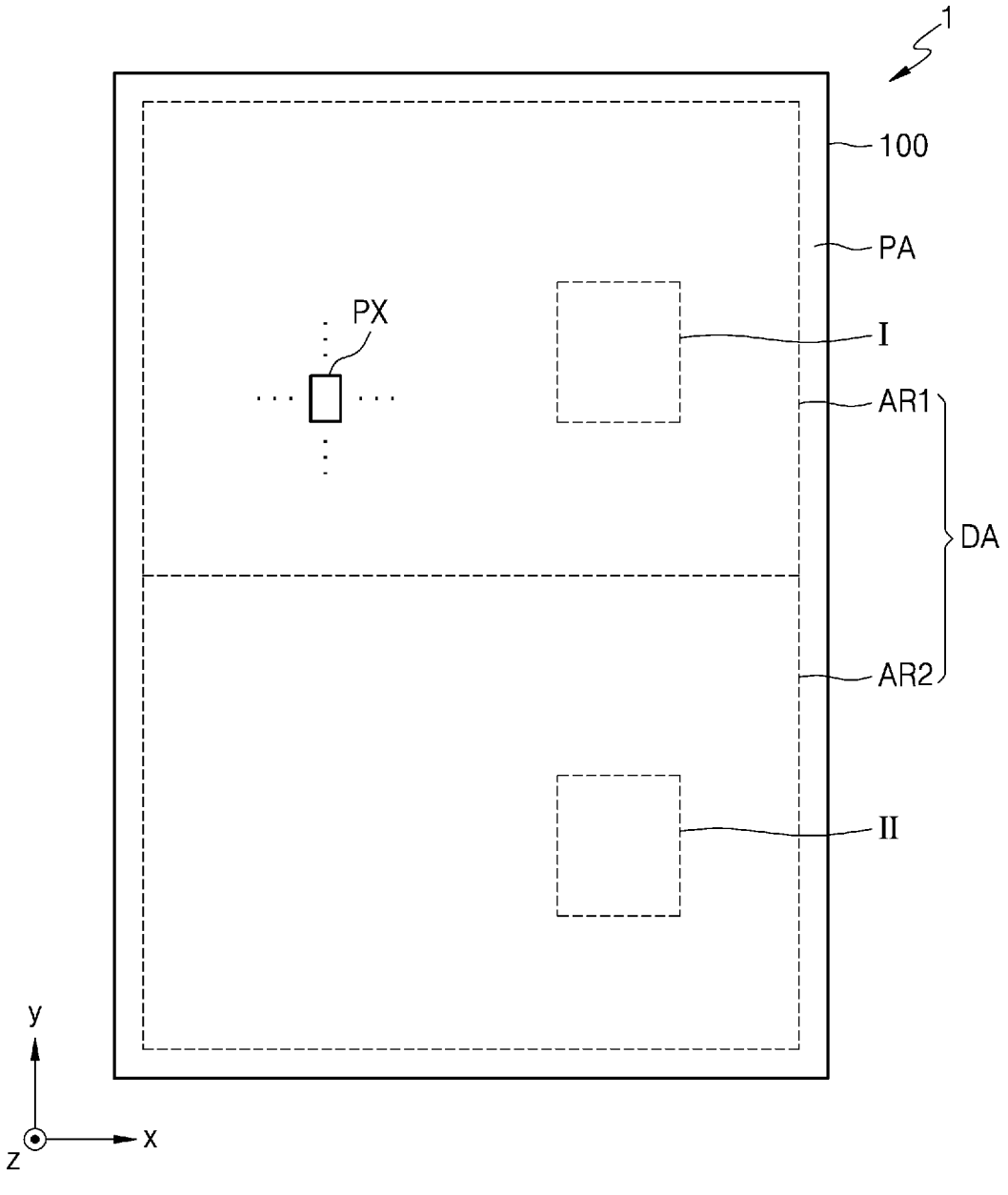
FIG. 1 is a schematic plan view of a display apparatus according to an embodiment.

FIG. 1 is a schematic plan view of a display apparatus 1 according to an embodiment.

Referring to FIG. 1, the display apparatus 1 may include a display area DA for displaying an image and a peripheral area PA surrounding at least a portion of the display area DA. The display apparatus 1 may provide an image to the outside by using light emitted from the display area DA. As the display apparatus 1 includes a substrate 100, it can be said that the substrate 100 includes the display area DA and the peripheral area PA described above. In other words, the display area DA and the peripheral area PA described above may be defined in the substrate 100.

The substrate 100 may include various materials, such as glass, metal or plastic, or the like. According to an embodiment, the substrate 100 may include a flexible material. The flexible material refers to a material that is well flexible, bendable, foldable, and rollable. The substrate 100 including the flexible material may be composed of ultra-thin glass, metal, or plastic.

The display area DA may be provided in a rectangular shape as illustrated in FIG. 1. In another embodiment, the display area DA may have a polygonal shape, such as a triangle, a pentagon, a hexagon, or the like, a circular shape, an oval shape, an amorphous shape, or the like.

A plurality of pixels PX including various display elements, such as an organic light-emitting diode ("OLED"), may be disposed in the display area DA of the substrate 100. The pixels PX may be arranged in various forms, such as a stripe arrangement, a pentile arrangement, a mosaic arrangement, or the like, to implement an image. In the specification, each pixel PX may mean a sub-pixel that emits light of a different color, and each pixel PX may be one of, for example, a red sub-pixel, a green sub-pixel, and a blue sub-pixel.

As a display apparatus according to an embodiment of the disclosure, an organic light-emitting display apparatus (an organic light-emitting display) is described as an example, but the display apparatus of the disclosure is not limited thereto. In another embodiment, the display apparatus may be an inorganic light-emitting display apparatus (an inorganic light-emitting display or an inorganic EL display apparatus), or a quantum-dot light-emitting display. For example, a light-emitting layer of a display element provided in a display apparatus may include an organic material, an inorganic material, quantum dots, an organic material and quantum dots, an inorganic material and quantum dots, or an organic material, an inorganic material, and quantum dots.

The display area DA may include a first area AR1 and a second area AR2. As described below in FIG. 2, the first area AR1 may include first pixel areas PXAR1 arranged at a first pitch pt1 in a first direction, for example, ±y directions, and the second area AR2 may include second pixel areas PXAR2 arranged at a second pitch pt2 different from the first pitch pt1 in the first direction, for example, ±y directions.

Although FIG. 1 illustrates that the size of the first area AR1 is the same as the size of the second area AR2, in another embodiment, the size of the first area AR1 may be different from the size of the second area AR2. Furthermore, in an embodiment, the first area AR1 and the second area AR2 may each include a plurality of areas. The first areas AR1 and the second areas AR2 may be arranged alternately with each other in one direction.

The peripheral area PA of the substrate 100, which is an area arranged around the display area DA, may be an area in which no image is displayed. Various wirings for transmitting electrical signals to be applied to the display area DA, or pads on which a printed circuit board or a driver IC chip is attached, may be located in the peripheral area PA.

Figure 2:
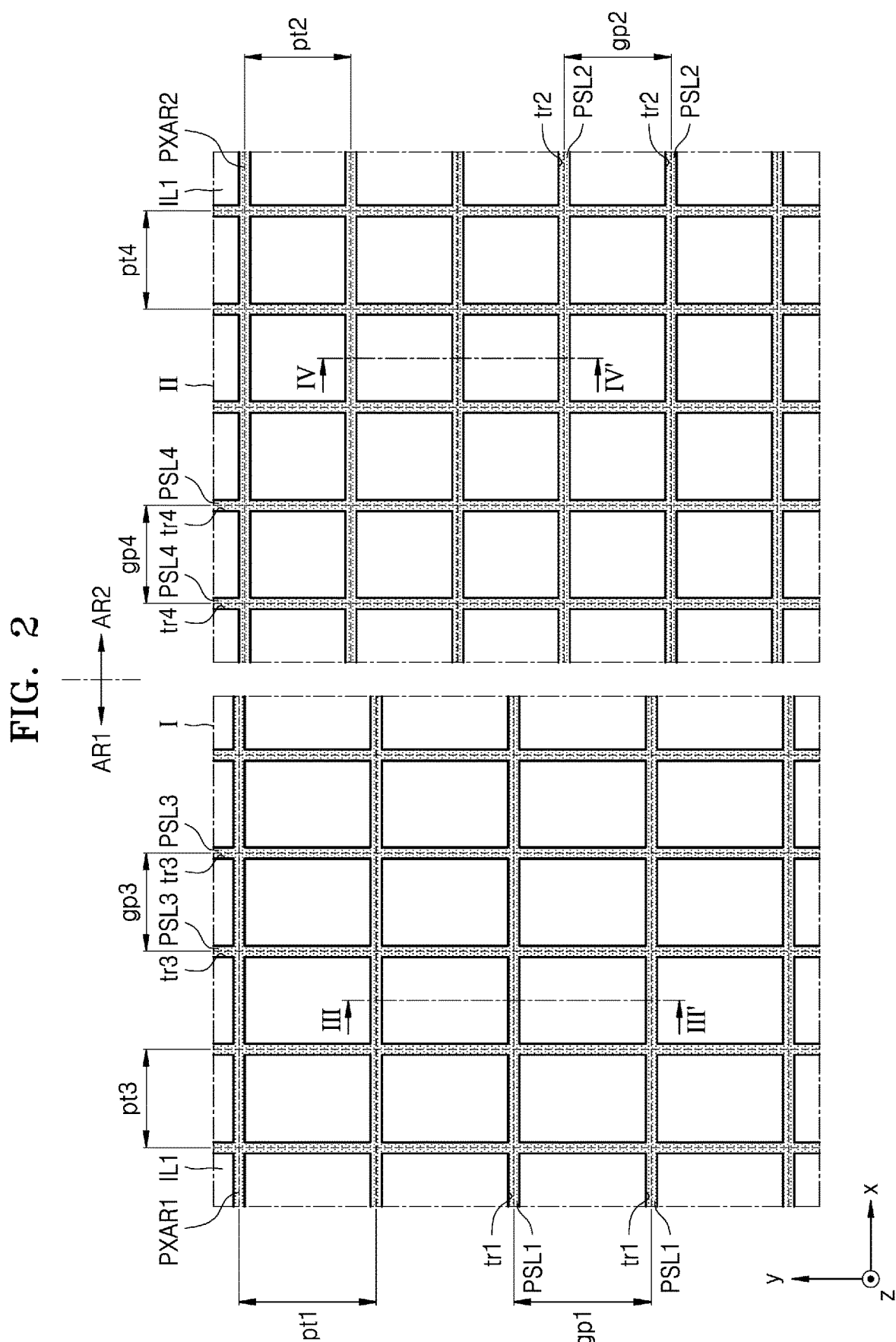
FIG. 2 is an enlarged plan view of examples of a region I and a region II of FIG. 1.

FIG. 2 is an enlarged plan view of examples of a region I and a region II of FIG. 1.

Referring to FIG. 2, the display apparatus 1 (see FIG. 1) may include the substrate 100 (see FIG. 1) including the first area AR1 and the second area AR2 (or in which the first area AR1 and the second area AR2 are defined), a first insulating layer IL1, and first to fourth pixel separation films PSL1, PSL2, PSL3, and PSL4.

The first area AR1 may include the first pixel areas PXAR1 arranged in the first direction, for example, ±y directions, and a second direction, for example, ±x directions. The second area AR2 may include the second pixel areas PXAR2 arranged in the first direction, for example, ±y directions, and the second direction, for example, ±x directions.

In an embodiment, the first pixel areas PXAR1 may be arranged at the first pitch pt1 in the first direction, for example, ±y directions, and the second pixel areas PXAR2 may be arranged at the second pitch pt2 in the first direction, for example, ±y directions. The first pitch pt1 and the second pitch pt2 may be different from each other. For example, the second pitch pt2 may be less than the first pitch pt1.

In an embodiment, the first pixel areas PXAR1 may be arranged at a third pitch pt3 in the second direction, for example, ±x directions, and the second pixel areas PXAR2 may be arranged at a fourth pitch pt4 in the second direction, for example, ±x directions. The third pitch pt3 may be substantially the same as the fourth pitch pt4.

The first insulating layer IL1 may be disposed on the substrate 100. The first insulating layer IL1 may have first to fourth trenches tr1, tr2, tr3, and tr4. The first trenches tr1 may correspond to the boundaries of the first pixel areas PXAR1, respectively, neighboring in the first direction, for example, ±y directions, among the first pixel areas PXAR1, and the second trenches tr2 may correspond to the boundaries of the second pixel areas PXAR2, respectively, neighboring in the first direction, for example, ±y directions, among the second pixel areas PXAR2. The third trenches tr3 may correspond to the boundaries of the first pixel areas PXAR1, respectively, neighboring in the second direction, for example, ±x directions, among the first pixel areas PXAR1, and the fourth trenches tr4 may correspond to the boundaries of the second pixel areas PXAR2, respectively, neighboring in the second direction, for example, ±x directions, among the second pixel areas PXAR2.

The first pixel separation films PSL1 may be buried in the first trenches tr1, respectively, the second pixel separation films PSL2 may be buried in the second trenches tr2, respectively, the third pixel separation films PSL3 may be buried in the third trenches tr3, respectively, and the fourth pixel separation films PSL4 may be buried in the fourth trenches tr4, respectively. The first pixel separation films PSL1 and the third pixel separation films PSL3 may have a grid shape (or a mesh structure). The second pixel separation films PSL2 and the fourth pixel separation films PSL4 may have a grid shape (or a mesh structure).

Although FIG. 2 illustrates that the first pixel area PXAR1 is entirely surrounded by the first pixel separation films PSL1 and the third pixel separation films PSL3, in another embodiment, the first pixel area PXAR1 may be partially surrounded by the first pixel separation films PSL1 and the third pixel separation films PSL3. The above descriptions about the first pixel area PXAR1 may be identically applied to the second pixel area PXAR2. For example, although FIG. 2 illustrates that the second pixel area PXAR2 is entirely surrounded by the second pixel separation films PSL2 and the fourth pixel separation films PSL4, in another embodiment, the second pixel area PXAR2 may be partially surrounded by the second pixel separation films PSL2 and the fourth pixel separation films PSL4.

In an embodiment, a first gap gp1 between the first pixel separation films PSL1 neighboring each other in the first direction, for example, ±y directions, among the first pixel separation films PSL1 may be different from a second gap gp2 between the second pixel separation films PSL2 neighboring each other in the first direction, for example, ±y directions, among the second pixel separation films PSL2. For example, the first gap gp1 may be greater than the second gap gp2.

In an embodiment, a third gap gp3 between the third pixel separation films PSL3 neighboring each other in the second direction, for example, ±x directions, among the third pixel separation films PSL3 may be substantially the same as a fourth gap gp4 between the fourth pixel separation films PSL4 neighboring each other in the second direction, for example, ±x directions, among the fourth pixel separation films PSL4.

In an embodiment, the first to fourth pixel separation films PSL1, PSL2, PSL3, and PSL4 may include a material different from a material of the first insulating layer IL1. For example, the first insulating layer IL1 may include an inorganic material, whereas the first to fourth pixel separation films PSL1, PSL2, PSL3, and PSL4 may include an organic material. As the first to fourth pixel separation films PSL1, PSL2, PSL3, and PSL4 include an organic material, cracks formed in the first insulating layer IL1 including an inorganic material in one pixel due to external impacts may be effectively prevented or reduced from growing into an adjacent pixel.

Figure 3:
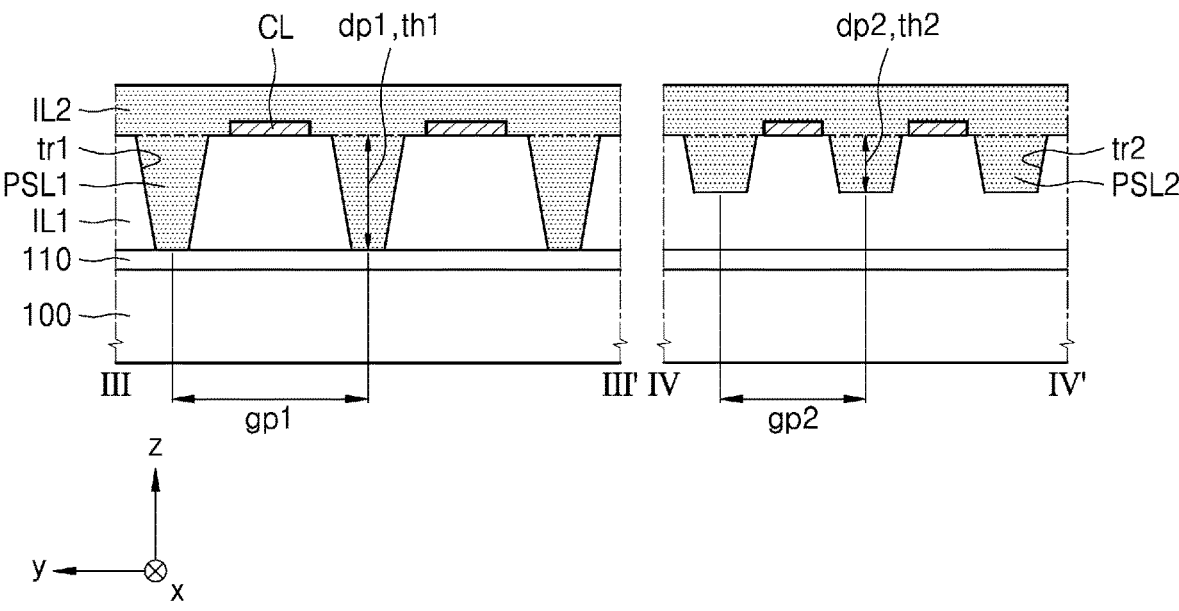
FIG. 3 is an exemplary cross-sectional view of a portion of the display apparatus of FIG. 2 taken along line III-III' and line IV-IV'.

FIG. 3 is an exemplary cross-sectional view of a portion of the display apparatus 1 of FIG. 2 taken along line III-III' and line IV-IV'.

Referring to FIG. 3, the display apparatus 1 (see FIG. 1) may include the substrate 100, a barrier layer 110, the first insulating layer IL1, a second insulating layer IL2, first and second pixel separation films PSL1 and PSL2, and a conductive layer CL.

The substrate 100 may include glass or polymer resin. Polymer resin may include polyethersulfone, polyacrylate, polyetherimide, polyethylene naphthalate, polyethylene terephthalate, polyphenylene sulfide, polyarylate, polyimide, polycarbonate or cellulose acetate propionate, or the like. The substrate 100 including polymer resin may be flexible, rollable, or bendable. The substrate 100 may have a multilayer structure of a layer including polymer resin described above and an inorganic layer.

The barrier layer 110 may be disposed on the substrate 100. The barrier layer 110 may prevent or reduce infiltration of impurities from the substrate 100 or the like into display apparatus 1. The barrier layer 110 may include an inorganic material, such as oxide or nitride, an organic material, or an organic/inorganic composite, and may have a single layer or multilayer structure of an inorganic material and an organic material.

The first insulating layer IL1 may be disposed on the barrier layer 110. The first insulating layer IL1 may include a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), or the like. The first insulating layer IL1 may include the first trenches tr1 and the second trenches tr2. In FIG. 2, as described above, the first trenches tr1 may correspond to the boundaries of the first pixel areas PXAR1, respectively, and the second trenches tr2 may correspond to the boundaries of the second pixel areas PXAR2, respectively.

In an embodiment, a first depth dp1 of the first trench tr1 along a thickness direction, for example, ±z directions, of the substrate 100 may be different from a second depth dp2 of the second trench tr2 along the thickness direction, for example, ±z directions, of the substrate 100. For example, the first depth dp1 may be greater than the second depth dp2. The above descriptions about the first trench tr1 and the second trench tr2 may be identically applied to the third trench tr3 and the fourth trench tr4 of FIG. 2. The depth of the third trench tr3 along the thickness direction, for example, ±z directions, of the substrate 100 may be greater than the depth of the fourth trench tr4 along the thickness direction, for example, ±z directions, of the substrate 100.

A first pixel separation film PSL1 may be disposed in the first trench tr1, and a second pixel separation film PSL2 may be disposed in the second trench tr2. In other words, the first pixel separation film PSL1 may be buried in the first trench tr1, and the second pixel separation film PSL2 may be buried in the second trench tr2. As the first and second pixel separation films PSL1 and PSL2 are buried in the first and second trenches tr1 and tr2, respectively, a step of the first insulating layer IL1 generated by the first and second trenches tr1 and tr2 may be removed or reduced. The first and second pixel separation films PSL1 and PSL2 may each be formed in a single layer or multilayer of a film including an organic material. For example, the first and second pixel separation films PSL1 and PSL2 may include general purpose polymers, such as benzocyclobutene ("BCB"), polyimide, hexamethyldisiloxane ("HMDSO"), polymethylmethacrylate ("PMMA"), or polystyrene ("PS"), polymer derivatives having a phenolic group, acrylic polymers, imide-based polymers, aryl ether-based polymers, amide-based polymers, fluorine-based polymers, p-xylene-based polymers, vinyl alcohol-based polymers, blends thereof, or the like.

In an embodiment, the first gap gp1 between the first pixel separation films PSL1 neighboring each other in the first direction, for example, ±y directions, among the first pixel separation films PSL1 may be different from the second gap gp2 between the second pixel separation films PSL2 neighboring each other in the first direction, for example, ±y directions, among the second pixel separation films PSL2. For example, the first gap gp1 may be greater than the second gap gp2.

In an embodiment, a first thickness th1 of the first pixel separation film PSL1 along the thickness direction, for example, ±z directions, of the substrate 100 may be different from a second thickness th2 of the second pixel separation film PSL2 along the thickness direction, for example, ±z directions, of the substrate 100. For example, the first thickness th1 may be greater than the second thickness th2. The above descriptions about the first pixel separation film PSL1 and the second pixel separation film PSL2 may be identically applied to the third pixel separation film PSL3 and the fourth pixel separation film PSL4 of FIG. 2. A thickness of the third pixel separation film PSL3 along the thickness direction, for example, ±z directions, of the substrate 100 may be greater than a thickness of the of the fourth pixel separation film PSL4 along the thickness direction, for example, ±z directions, of the substrate 100.

The conductive layer CL may be disposed on the first insulating layer IL1. The conductive layer CL may include a conductive material including molybdenum (Mo), aluminum (Al), copper (Cu), titanium (Ti), or the like, and may be formed in a single layer or multilayer including the above materials. As an example, the conductive layer CL may have a multilayer structure of Ti/Al/Ti.

The second insulating layer IL2 may be disposed on the first insulating layer IL1 to cover the conductive layer CL. The second insulating layer IL2 may be formed in a single layer or multilayer of a film including an organic material, and may provide a flat upper surface. The second insulating layer IL2 as above may include general purpose polymers, such as BCB, polyimide, HMDSO, PMMA, or PS, polymer derivatives having a phenolic group, acrylic polymers, imide-based polymers, aryl ether-based polymers, amide-based polymers, fluorine-based polymers, p-xylene-based polymers, vinyl alcohol-based polymers, blends thereof, or the like.

In an embodiment, the second insulating layer IL2 may form one body with the first and second pixel separation films PSL1 and PSL2.

Figure 4:
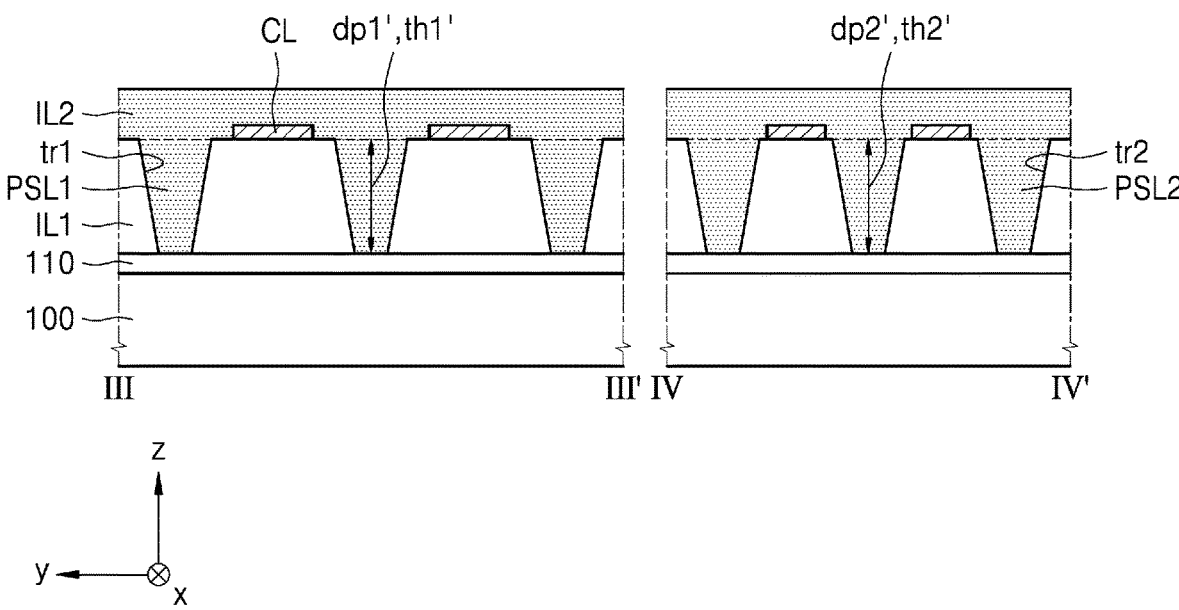
FIG. 4 is another exemplary cross-sectional view of a portion of the display apparatus of FIG. 2 taken along line III-III' and line IV-IV'.

FIG. 4 is another exemplary cross-sectional view of a portion of the display apparatus 1 of FIG. 2 taken along line III-III' and line IV-IV'. FIG. 4 illustrates a modified embodiment of FIG. 3 having a difference in the structures of the trench and the pixel separation film. In the following description, redundant descriptions with the embodiment of FIG. 3 are omitted and only the differences are described.

Referring to FIG. 4, in an embodiment, a first depth dp1' of the first trench tr1 along the thickness direction, for example, ±z directions, of the substrate 100 may be substantially the same as a second depth dp2' of the second trench tr2 along the thickness direction, for example, ±z directions, of the substrate 100. The above descriptions about the first trench tr1 and the second trench tr2 may be identically applied to the third trench tr3 and the fourth trench tr4 of FIG. 2. The depth of the third trench tr3 along the thickness direction, for example, ±z directions, of the substrate 100 may be substantially the same as the depth of the fourth trench tr4 along the thickness direction, for example, ±z directions, of the substrate 100.

In an embodiment, a first thickness th1' of the first pixel separation film PSL1 along the thickness direction, for example, ±z directions, of the substrate 100 may be substantially the same as a second thickness th2' of the second pixel separation film PSL2 along the thickness direction, for example, ±z directions, of the substrate 100. The above descriptions about first pixel separation film PSL1 and the second pixel separation film PSL2 may be identically applied to the third pixel separation film PSL3 and the fourth pixel separation film PSL4 of FIG. 2. The thickness of the third pixel separation film PSL3 along the thickness direction, for example, ±z directions, of the substrate 100 may be substantially the same as the thickness of the fourth pixel separation film PSL4 along the thickness direction, for example, ±z directions, of the substrate 100.

Figure 5:
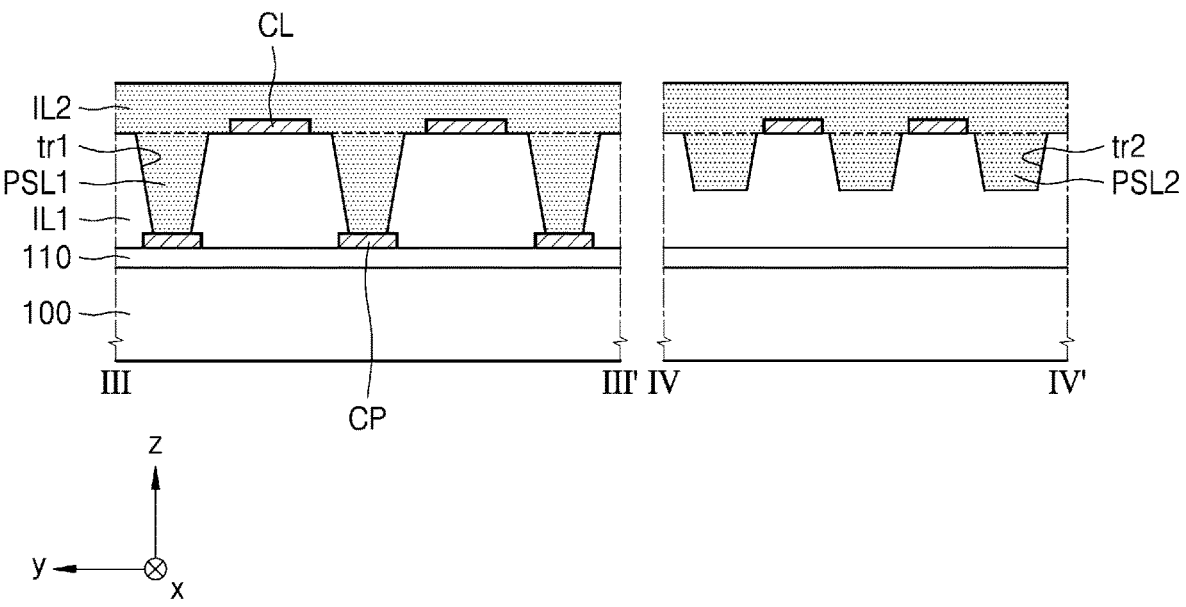
FIG. 5 is still another exemplary cross-sectional view of a portion of the display apparatus of FIG. 2 taken along line III-III' and line IV-IV'.

FIG. 5 is still another exemplary cross-sectional view of a portion of the display apparatus 1 of FIG. 2 taken along line III-III' and line IV-IV'. FIG. 5 illustrates a modified embodiment of FIG. 3 having a difference in the structure of a conductive pattern. In the following description, redundant descriptions with the embodiment of FIG. 3 are omitted and only the differences are described.

Referring to FIG. 5, the display apparatus 1 (see FIG. 1) may include conductive patterns CP. The conductive patterns CP may be provided between the substrate 100 and the first pixel separation films PSL1, and may contact the first pixel separation films PSL1, respectively. The conductive patterns CP may include a conductive material including Mo, Al, Cu, Ti, or the like, and may be formed in a single layer or multilayer including the above materials. As an example, the conductive patterns CP may be a single layer of Mo.

The conductive patterns CP may assist forming an etching depth to be uniform when etching the first insulating layer IL1 to form the first trench tr1. By arranging the conductive patterns CP between the substrate 100 and the first pixel separation films PSL1, the first trenches tr1 with a uniform depth may be formed in the first insulating layer IL1.

Figure 6:
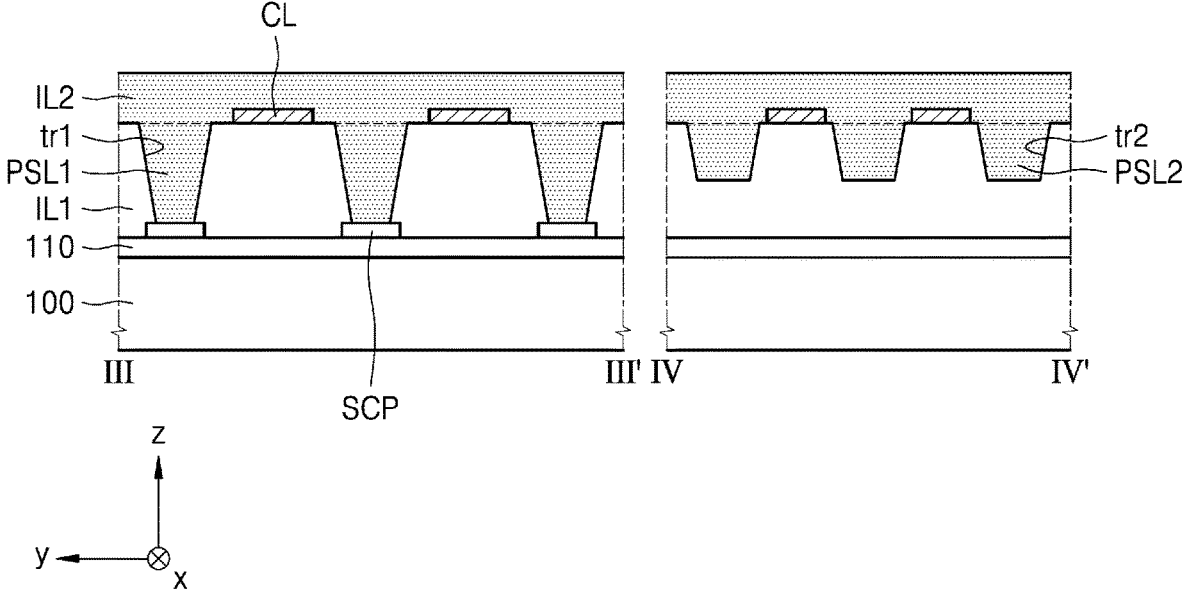
FIG. 6 is yet another exemplary cross-sectional view of a portion of the display apparatus of FIG. 2 taken along line III-III' and line IV-IV'.

FIG. 6 is yet another exemplary cross-sectional view of a portion of the display apparatus 1 of FIG. 2 taken along line III-III' and line IV-IV'. FIG. 6 illustrates a modified embodiment of FIG. 3 having a difference in the structure of a semiconductor pattern. In the following description, redundant descriptions with the embodiment of FIG. 3 are omitted and only the differences are described.

Referring to FIG. 6, the display apparatus 1 (see FIG. 1) may include semiconductor patterns SCP. The semiconductor patterns SCP may be provided between the substrate 100 and the first pixel separation films PSL1, and may contact the first pixel separation films PSL1, respectively. The semiconductor patterns SCP may include amorphous silicon or polysilicon. In another embodiment, the semiconductor patterns SCP may include at least one oxide selected from among indium (In), gallium (Ga), stannum (Sn), zirconium (Zr), vanadium (V), hafnium (Hf), cadmium (Cd), germanium (Ge), chromium (Cr), Ti, Al, cesium (Cs), cerium (Ce), and zinc (Zn).

The semiconductor patterns SCP may assist forming an etching depth to be uniform when etching the first insulating layer IL1 to form the first trench tr1. By arranging the semiconductor patterns SCP between the substrate 100 and the first pixel separation films PSL1, the first trenches tr1 with a uniform depth may be formed in the first insulating layer IL1.

Figure 7:
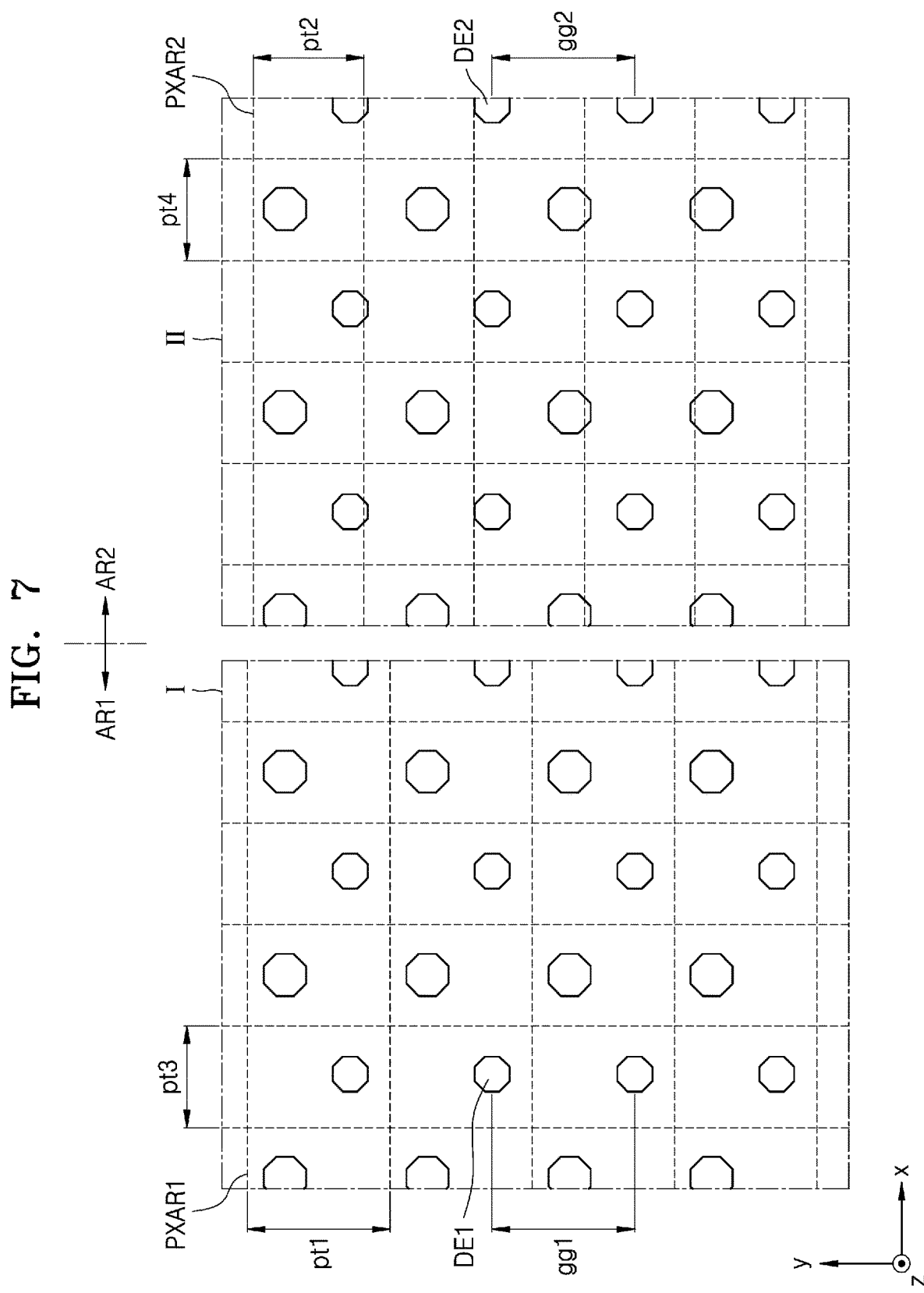
FIG. 7 is an enlarged plan view of examples of the region I and the region II of FIG. 1.

FIG. 7 is an enlarged plan view of examples of the region I and the region II of FIG. 1. Throughout FIG. 7 and FIG. 2, like reference numerals denote like elements, and thus, redundant descriptions thereof are omitted.

Referring to FIG. 7, the display apparatus 1 (see FIG. 1) may include first display elements DE1 and the second display elements DE2. The first display elements DE1 may be arranged in the first area AR1 in the first direction, for example, ±y directions, and in the second direction, for example, ±x directions. The second display elements DE2 may be arranged in the second area AR2 in the first direction, for example, ±y directions, and in the second direction, for example, ±x directions.

In an embodiment, a first gap gg1 between the first display elements DE1 neighboring each other in the first direction, for example, ±y directions, among of the first display elements DE1 may be substantially the same as a second gap gg2 between the second display elements DE2 neighboring each other in the first direction, for example, ±y directions, among a plurality of the second display elements DE2. The first pitch pt1 of the first pixel areas PXAR1 arranged in the first area AR1 along the first direction, for example, ±y directions, may be different from the second pitch pt2 of the second pixel areas PXAR2 arranged in the second area AR2 along the first direction, for example, ±y directions, but the first gap gg1 may be substantially the same as the second gap gg2.

Figure 8:
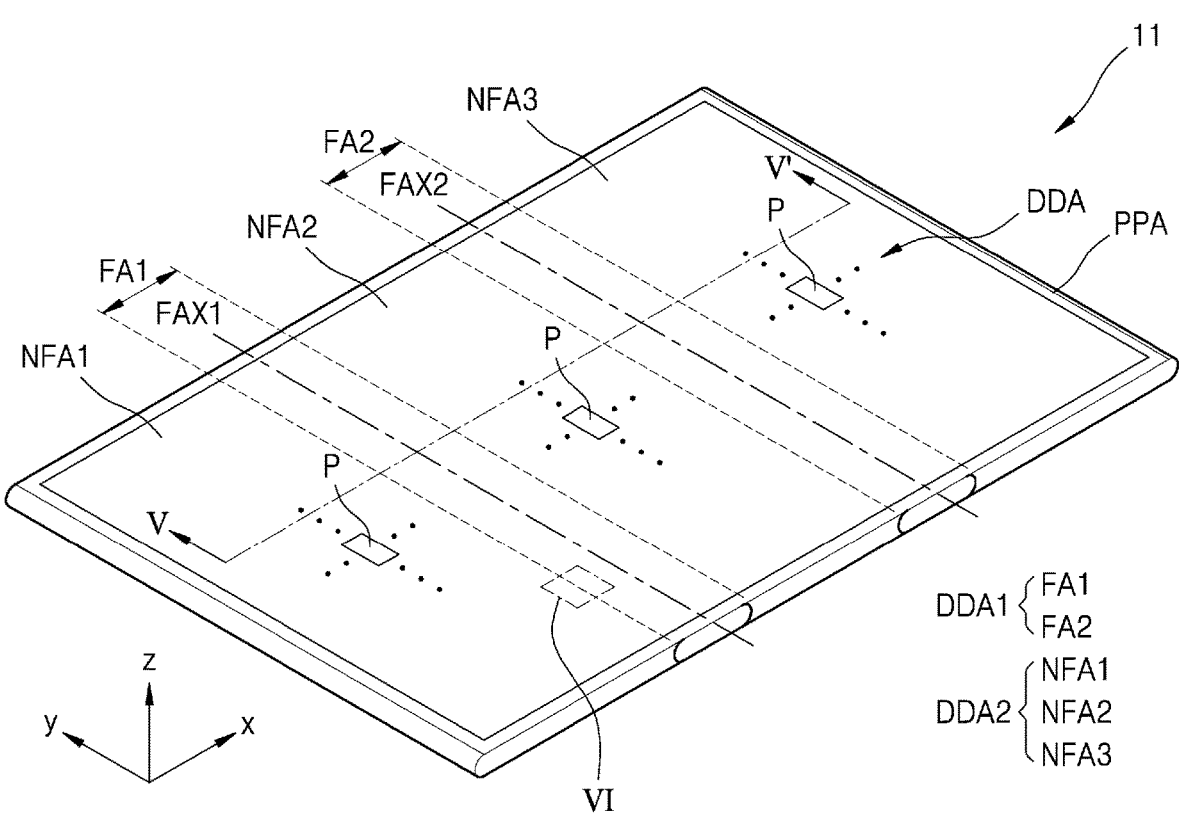
FIG. 8 is a schematic perspective view of a display apparatus according to an embodiment.
Figure 9:
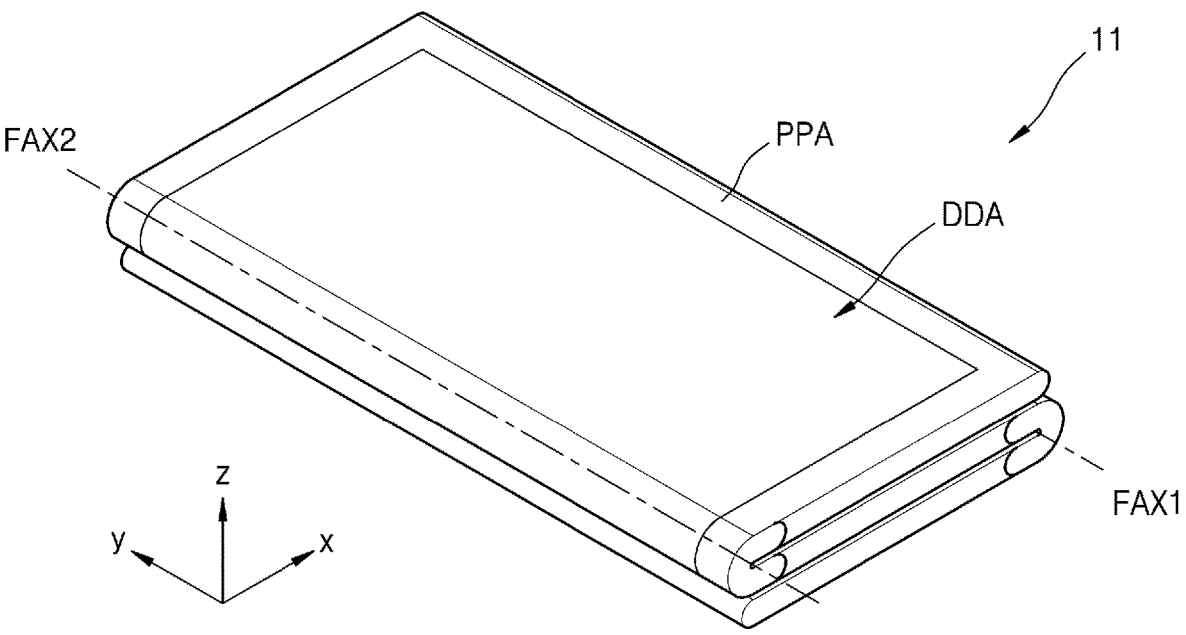
FIG. 9 is a schematic perspective view showing a folded shape of a display apparatus according to an embodiment.

FIG. 8 is a schematic perspective view of a display apparatus 11 according to an embodiment. FIG. 9 is a schematic perspective view showing a folded shape of the display apparatus 11 according to an embodiment. FIG. 8 is a perspective view of the display apparatus 11 in an unfolded state, and FIG. 9 is a perspective view of the display apparatus 11 in a folded state.

The display apparatus 11, which is an apparatus for displaying a video or a still image, may be used as a display screen of various products including not only portable electronic devices, such as a mobile phone, a smart phone, a tablet personal computer ("PC"), a mobile communication terminal, an electronic organizer, an electronic book, a portable multimedia player ("PMP"), a navigation device, an ultra-mobile PC ("UMPC"), and the like, but also a television, a notebook computer, a monitor, a billboard, internet of things ("IOT"), and the like. Furthermore, the display apparatus 11 may be used in wearable devices, such as a smart watch, a watch phone, a glasses-type display, a head mounted display ("HMD"), and the like. Furthermore, the display apparatus 11 may be used as a center information display ("CID") arranged in an instrument panel of a vehicle, and a center fascia or dashboard of a vehicle, a room mirror display in lieu of a side mirror of a vehicle, or a display arranged at the back surface of a front seat as a rear seat entertainment of a vehicle.

The display apparatus 11 may be unfolded entirely flat, as illustrated in FIG. 8. The display apparatus 11 may be foldable or bendable, as illustrated in FIG. 9.

In an embodiment, the display apparatus 11 may be folded such that display surfaces thereof face each other. In another embodiment, the display apparatus 11 may be folded such that display surfaces face the outside. The "display surface" is a surface where an image is displayed, may include a display area DDA and a peripheral area PPA, and may provide an image to a user through the display area DDA. The term "fold" refers that a shape is not fixed, but is deformable from the original shape to another shape, and may include being folded, curved, or rolled like a roll along one or more specific lines, that is, a folding axis.

Referring to FIGS. 8 and 9, the display apparatus 11 may include the display area DDA and the peripheral area PPA located outside the display area DDA. The display area DDA may be an area where a plurality of pixels P are arranged to display an image. The peripheral area PPA may surround the display area DDA, and may be a non-display area where the pixels P are not arranged.

The display area DDA may include a first display area DDA1 and a second display area DDA2. The first display area DDA1 may be a folding area that has flexibility and is foldable, and there may be one or more folding areas. The second display area DDA2 may be a non-folding area that is not foldable. Although, in an embodiment, an area that is not foldable is referred to as a non-folding area, this is merely for convenience of explanation, and the expression "non-folding" may include not only a case of being hard without flexibility, but also cases of having flexibility, the flexibility being less than that of one folding area, and having flexibility but not folded. The display apparatus 11 may display an image in the first display area DDA1 and the second display area DDA2.

The first display area DDA1 may include a first folding area FA1 and a second folding area FA2. The first folding area FA1 may be folded with respect to a first folding axis FAX1, and the second folding area FA2 may be folded with respect to a second folding axis FAX2. In an embodiment, the first folding area FA1 and the second folding area FA2 may each have a similar size. In another embodiment, the first folding area FA1 and the second folding area FA2 may each have a different size.

The second display area DDA2 may include a first non-folding area NFA1, a second non-folding area NFA2, and a third non-folding area NFA3. The first folding area FA1 may be provided between the first non-folding area NFA1 and the second non-folding area NFA2, and the second folding area FA2 may be provided between the second non-folding area NFA2 and the third non-folding area NFA3.

Various electronic devices, printed circuit boards, or the like may be electrically attached to the peripheral area PA, and a voltage line for supplying power to drive display elements, or the like, may be located in the peripheral area PA. For example, a scan driver for providing a scan signal to each pixel P, a data driver for providing a data signal to each pixel P, a supply line (a clock signal line, a carry signal line, a driving voltage line, or the like) for providing a signal input to the scan driver and the data driver, a main power line, or the like may be arranged in the peripheral area PA.

Figure 10:
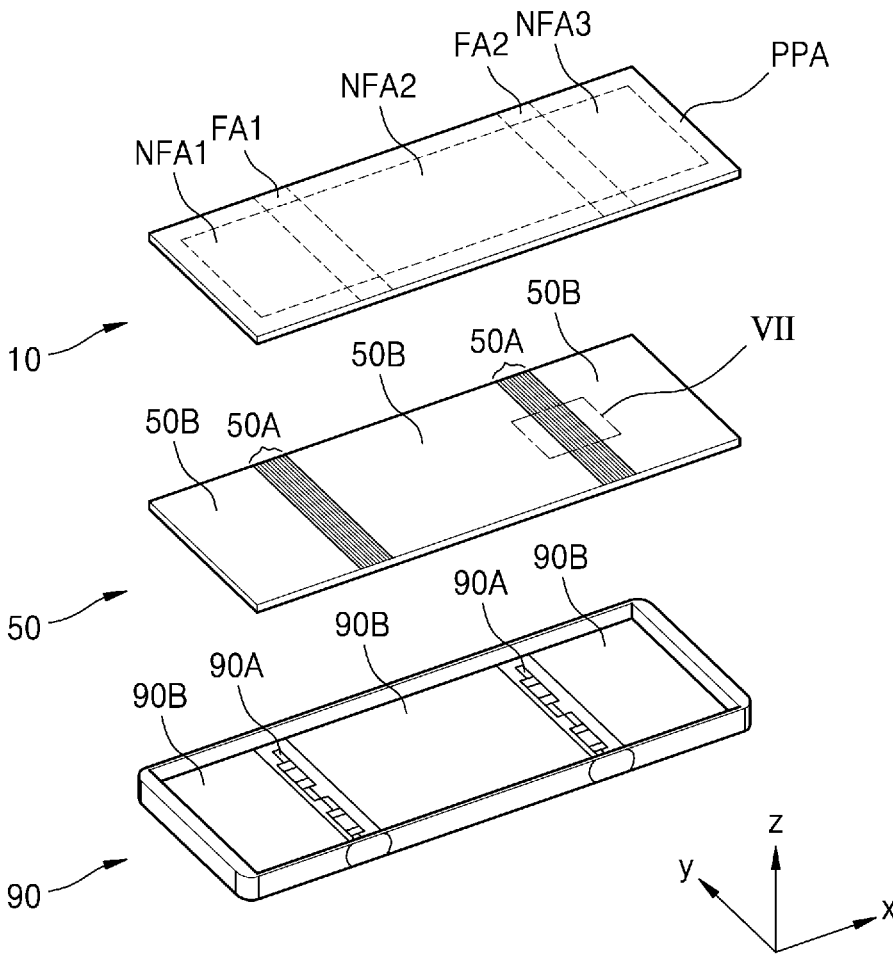
FIG. 10 is a schematic exploded perspective view showing the structure of the display apparatus of FIG. 8, according to an embodiment.
Figure 11A:
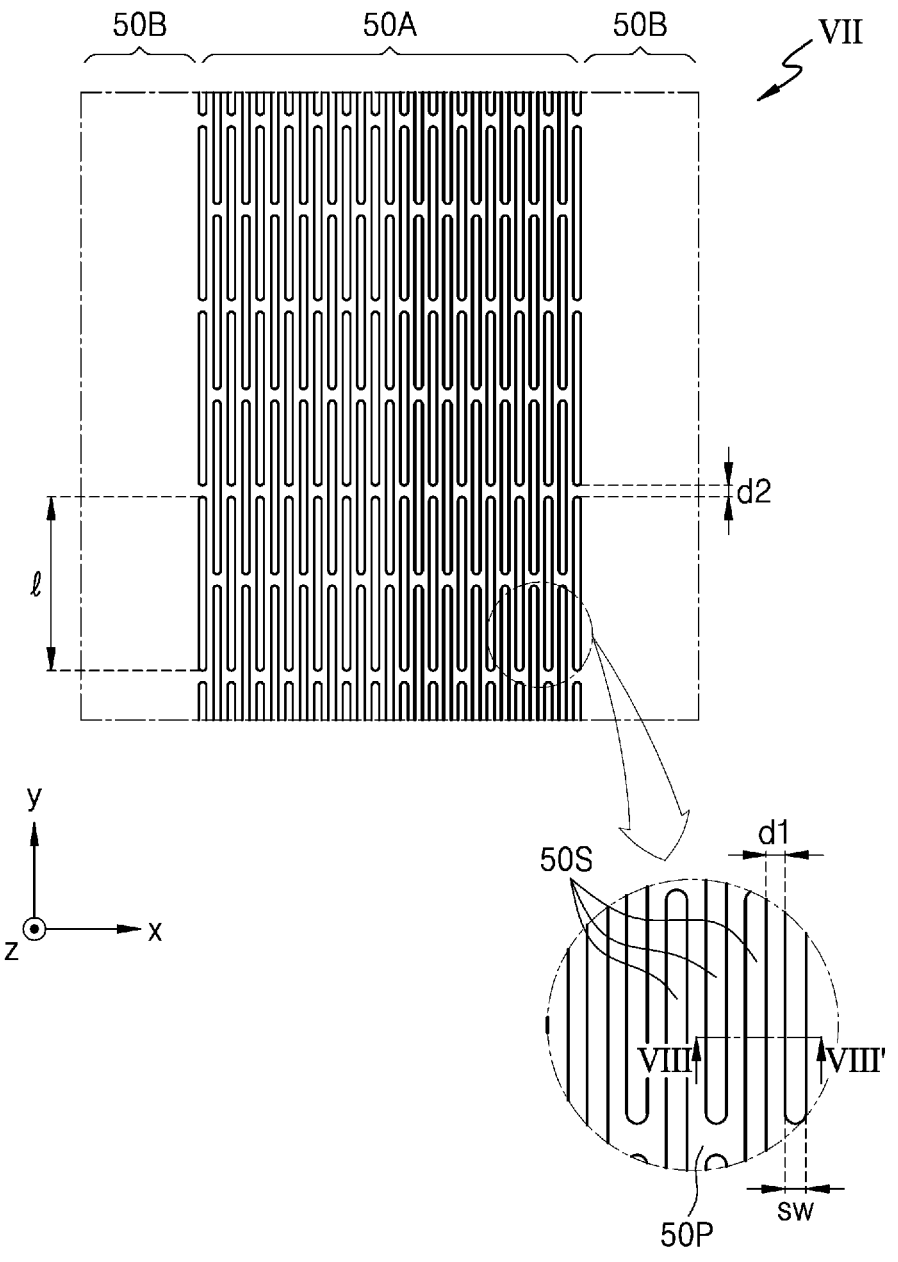
FIG. 11A is an enlarged plan view of an example of a region VII of the support layer of FIG. 10.
Figure 11B:
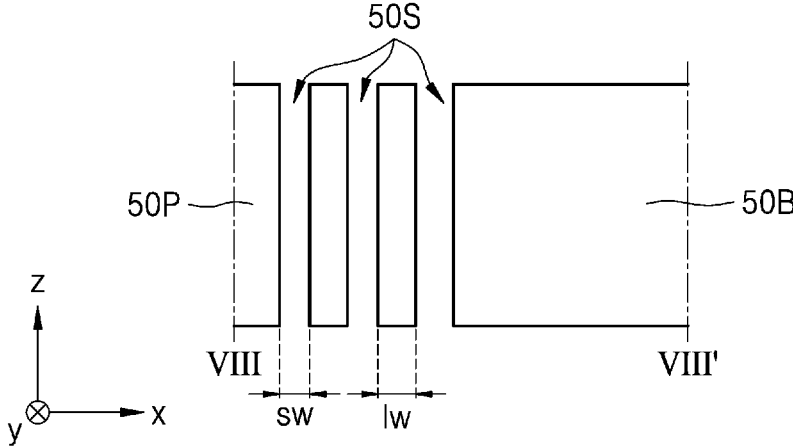
FIG. 11B is an example cross-sectional view of a portion of a support layer of FIG. 11A taken along line VIII-VIII'.
Figure 12:
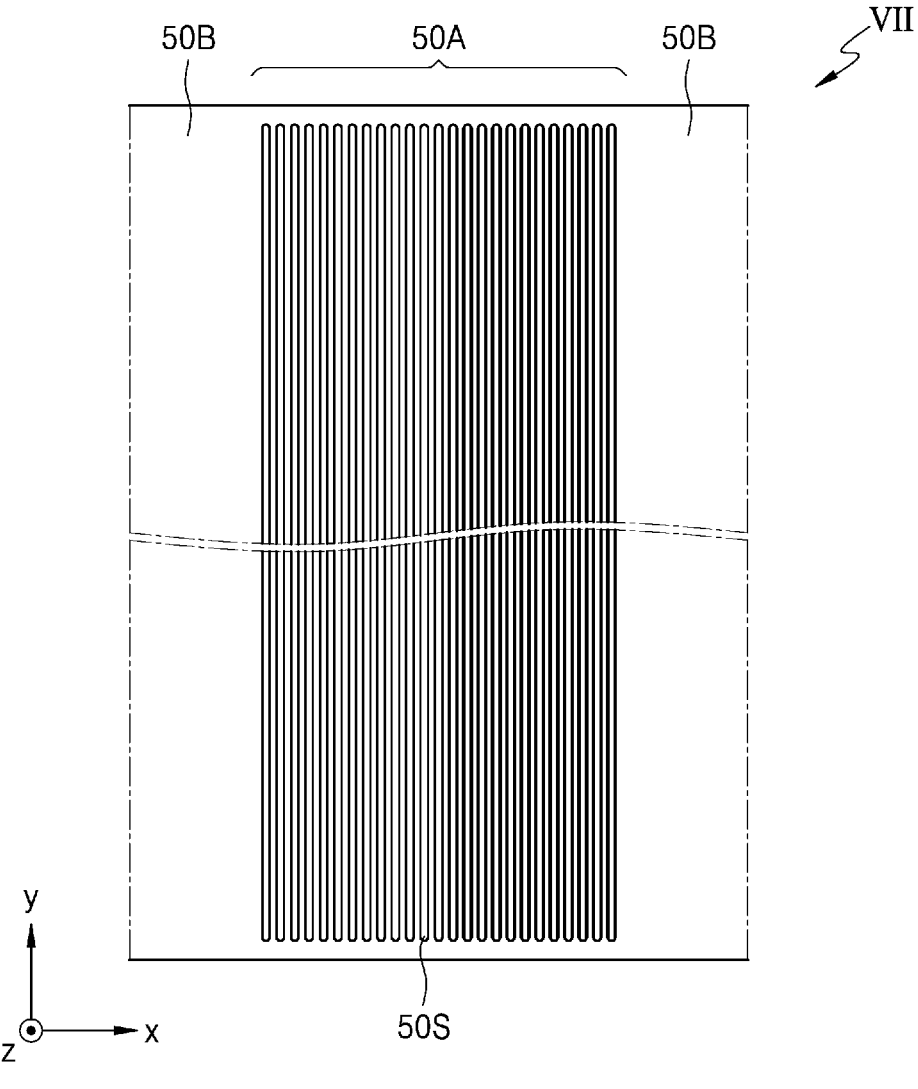
FIG. 12 is an enlarged plan view of another example of the region VII of the support layer of FIG. 10.
Figure 13:
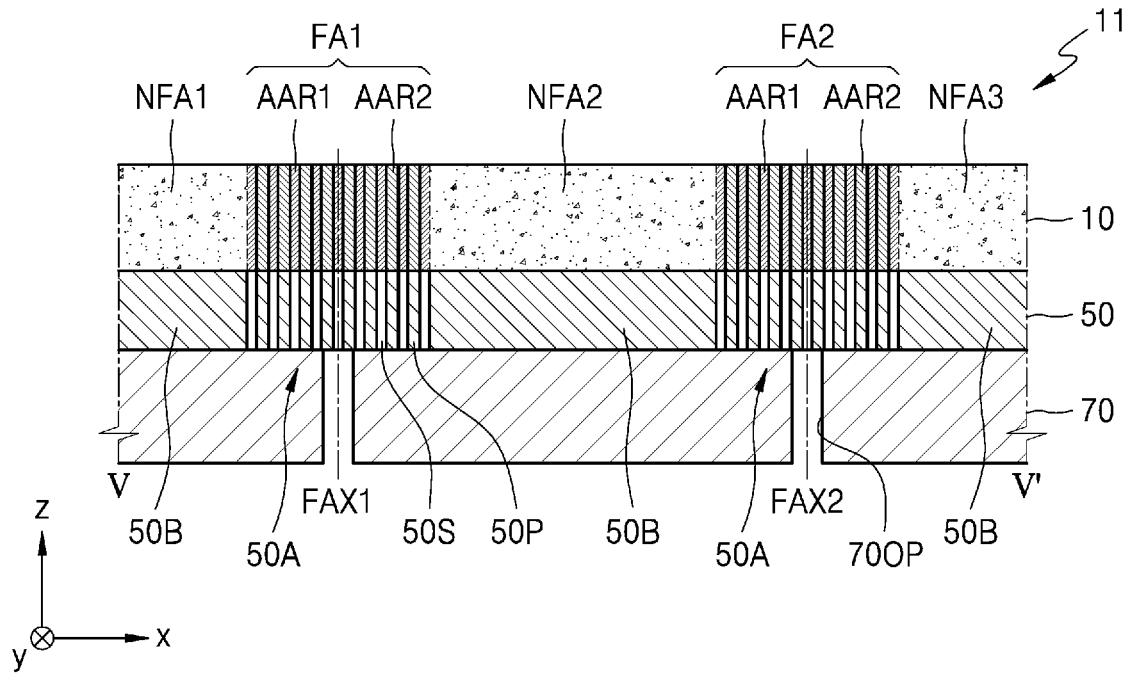
FIG. 13 is an exemplary cross-sectional view of a portion of the display apparatus of FIG. 8 taken along line V-V'.

FIG. 10 is a schematic exploded perspective view showing the structure of the display apparatus of FIG. 8, according to an embodiment. FIG. 11A is an enlarged plan view of an example of a region VII of the support layer of FIG. 10, and FIG. 11B is an example cross-sectional view of a portion of a support layer of FIG. 11A taken along line VIII-VIII'. FIG. 12 is an enlarged plan view of another example of a region VII of the support layer of FIG. 10. FIG. 13 is an exemplary cross-sectional view of a portion of the display apparatus of FIG. 8 taken along line V-V'.

Referring to FIG. 10, the display apparatus 11 may include a display panel 10, a support layer 50, and a lower cover 90.

The display panel 10 may include the display area DDA and the peripheral area PPA. The display area DDA may include the first display area DDA1 and the second display area DDA2. At least one folding area and at least one non-folding area may be defined in the display panel 10. At least one folding area may correspond to the first display area DDA1, and at least one non-folding area may correspond to the second display area DDA2.

The first display area DDA1 may include the first folding area FA1 and the second folding area FA2. The second display area DDA2 may include the first non-folding area NFA1, the second non-folding area NFA2, and the third non-folding area NFA3. The first display area DDA1 and the second display area DDA2 may be surrounded by the peripheral area PPA.

As illustrated in FIG. 13, the support layer 50 is disposed below the display panel 10 and may support the display panel 10. The support layer 50 may include a plurality of first support portions 50A and a plurality of second support portions 50B. The first support portions 50A and the second support portions 50B may be integrally formed (i.e., monolithic). The first support portions 50A may correspond to or overlap the first folding area FA1 and the second folding area FA2 of the display panel 10, respectively. The second support portions 50B may correspond to or overlap the first non-folding area NFA1, the second non-folding area NFA2, and the third non-folding area NFA3 of the display panel 10, respectively. The first support portion 50A may be located between the second support portions 50B.

Each of the first folding area FA1 and the second folding area FA2 of the display panel 10 may include first areas AAR1 and second areas AAR2. The first areas AAR1 of the first folding area FA1 and the second folding area FA2 may correspond to or overlap slits 50S of the first support portion 50A, respectively, and the second areas AAR2 of the first folding area FA1 and the second folding area FA2 may correspond to or overlap ribs 50P of the first support portion 50A, respectively. The first areas AAR1 and the second areas AAR2 may be alternately arranged with each other in a first direction, for example, ±x directions. Hereinafter, a case that the example of the first direction is ±x directions and the example of the second direction is ±y directions is used, different from the embodiments of FIGS. 1 to 7.

As described below with reference to FIG. 17, the first area AAR1 of the first folding area FA1 may include first pixel areas PPXAR1 arranged at first pitch CI1 in the first direction, for example, ±x directions, and the second area AAR2 of the first folding area FA1 may include second pixel areas PPXAR2 arranged at a second pitch CI2 different from the first pitch CI1 in the first direction, for example, ±x directions. The first non-folding area NFA1 may include third pixel areas PPXAR3 arranged at a third pitch CI3 in the first direction, for example, ±x directions. The first pitch CI1 may be substantially the same as the third pitch CI3. The above descriptions about the first folding area FA1 and the first non-folding area NFA1 may be identically applied to the second folding area FA2, the second non-folding area NFA2, and the third non-folding area NFA3.

The support layer 50 may have various structures according to the folding or unfolding state and the folding shape of the display apparatus 11. For example, when the display apparatus 11 is not folded, the shape of the support layer 50 is not changed, and the support layer 50 has a flat upper surface. During the folding of the display apparatus 11, the support layer 50 may be folded with the display panel 10. The first support portions 50A may each be folded with respect to the first folding axis FAX1 and the second folding axis FAX2.

The first support portions 50A may each have a certain pattern including the slits 50S. The slits 50S may be arranged in the ±y directions (the length direction or the second direction) and in the ±x directions (the widthwise direction or the first direction) perpendicular to the ±y directions. The slits 50S may have a length l along the ±y directions parallel to the folding axis of the folding area. For example, the slits 50S may have a long oval slot shape in the ±y directions.

In an embodiment, as illustrated in FIGS. 11A and 11B, each of the first support portions 50A may have a grid pattern in which the slits 50S having the same length are arranged apart from each other in the ±y directions and the ±x directions. A width lw of the rib (or a grid line) 50P of the grid pattern may be determined by a first gap d1 in the ±x directions and a second gap d2 in the ±y directions between the slits 50S. The slits 50S may be arranged with a regular or irregular gap in the ±y directions and/or the ±x directions. The slits 50S may have the same shape or different shapes. A degree of flexibility of the first support portion 50A may be determined by at least one of a length l and a width sw of the slit 50S, and the first gap d1 and the second gap d2 of the slits 50S. In another embodiment, as illustrated in FIG. 12, each of the first support portions 50A may have a slit pattern in which the slits 50S having the same length are arranged apart from each other in parallel in the ±x directions. The ribs 50P and the slits 50S of a slit pattern may alternate with each other in the ±x directions.

The support layer 50 may include at least one of glass, plastic, and metal. In an embodiment, the support layer 50 may include polyurethane or carbon fiber reinforced plastic. In an embodiment, the support layer 50 may include at least one of stainless steel, invar, nickel (Ni), cobalt (Co), a Ni alloy, and a Ni—Co alloy. In an embodiment, the support layer 50 may include austenitic stainless steels.

As illustrated in FIG. 13, a cushion layer 70 may be disposed below the support layer 50. The cushion layer 70 may prevent or reduce damage to the support layer 50 and the display panel 10 disposed on the cushion layer 70 from external impacts. In an embodiment, the cushion layer 70 may have an opening 70OP with respect to a folding axis.

The lower cover 90 may form the outer appearance of a lower surface of the display apparatus 11. The lower cover 90 may include plastic, metal, or both of plastic and metal. The lower cover 90 may include hinge areas 90A that overlap the first display areas DDA1 that are folding areas of the display panel 10 and the first support portions 50A of the support layer 50, and other planar portions 90B. The planar portions 90B may overlap the second display areas DDA2 that are non-folding areas of the display panel 10 and the second support portions 50B of the support layer 50. Each of the hinge areas 90A of the lower cover 90 may be folded with respect to the first folding axis FAX1 and the second folding axis FAX2.

Figure 14:
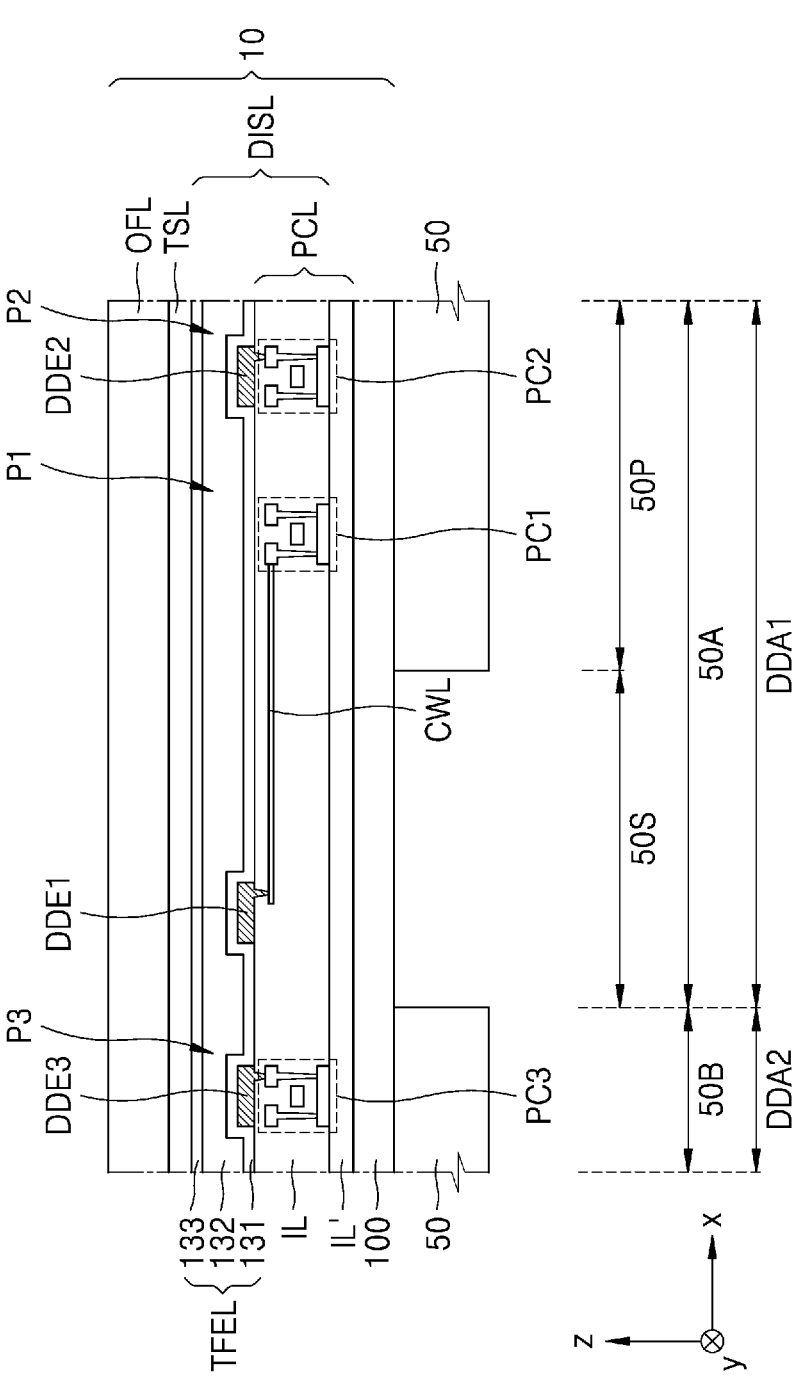
FIG. 14 is a schematic cross-sectional view of a portion of a display apparatus according to an embodiment.

FIG. 14 is a schematic cross-sectional view of a portion of a display apparatus according to an embodiment.

Referring to FIG. 14, the display apparatus 11 may include the display panel 10 and the support layer 50 arranged to overlap the display panel 10. A cover window (not shown) for protecting the display panel 10 may be further disposed above the display panel 10.

The display panel 10 may include the substrate 100, and a display layer DISL, a touch sensor layer TSL, and an optical functional layer OFL which are disposed on and above the substrate 100. The display panel 10 may include the first display area DDA1 and the second display area DDA2. The first display area DDA1 may be a folding area, and there may be one or more folding areas. The second display area DDA2 may be a non-folding area that is not folded.

The substrate 100 may include an insulating material, such as glass, quartz, polymer resin, or the like. The substrate 100 may be a flexible substrate that is bendable, foldable, rollable, or the like.

The display layer DISL may include a circuit layer PCL, display elements disposed on the circuit layer PCL, and an encapsulation layer, such as a thin film encapsulation layer TFEL or a sealing substrate (not shown). Insulating layers IL and IL' may be disposed between the substrate 100 and the display layer DISL and within the display layer DISL. In an embodiment, the display element may be an organic light-emitting diode including an organic light-emitting layer. Alternatively, the display element may be a light-emitting diode ("LED"). The size of LED may be on a micro-scale or a nano-scale. For example, the LED may be a micro LED. Alternatively, the LED may be a nanorod LED. The nanorod LED may include a gallium nitride (GaN). In an embodiment, a color conversion layer may be disposed on the nanorod LED. The color conversion layer may include quantum dots. Alternatively, the display element may be a quantum-dot LED including a quantum-dot light-emitting layer. Alternatively, the display element may be an inorganic LED including an inorganic semiconductor.

The first display area DDA1 of the display panel 10 may correspond to the first support portion 50A of the support layer 50, and the second display area DDA2 of the display panel 10 may correspond to the second support portion 50B of the support layer 50.

A first pixel P1 and a second pixel P2 may be disposed in the first display area DDA1. The first pixel P1 may include a first pixel circuit PC1 arranged to correspond to or overlap the rib 50P of the first support portion 50A and a first display element DDE1 connected to the first pixel circuit PC1 and arranged to correspond to or overlap the slit 50S. In other words, the first pixel circuit PC1 may not be arranged in an area corresponding to the slit 50S of the first display area DDA1. The first pixel circuit PC1 may include at least one thin film transistor, and control light-emission of the first display element DDE1. The first pixel circuit PC1 may be connected to the first display element DDE1 via a connection line CWL. The connection line CWL may overlap the rib 50P and the slit 50S of the first support portion 50A. The second pixel P2 may include a second pixel circuit PC2 arranged to correspond to or overlap the rib 50P of the first support portion 50A and a second display element DDE2 connected to the second pixel circuit PC2. The second pixel circuit PC2 may include at least one thin film transistor, and control light-emission of the second display element DDE2.

A third pixel P3 may be disposed in the second display area DDA2 of the display panel 10. The third pixel P3 may include a third pixel circuit PC3 and a third display element DDE3 connected to the third pixel circuit PC3. The third pixel circuit PC3 may include at least one thin film transistor, and control light-emission of the third display element DDE3.

The encapsulation layer may be disposed on the display elements. The display elements may be covered with the thin film encapsulation layer TFEL or the sealing substrate.

In an embodiment, the thin film encapsulation layer TFEL may include at least one inorganic encapsulation layer and at least one organic encapsulation layer. In an embodiment, the thin film encapsulation layer TFEL may include a first inorganic encapsulation layer 131, an organic encapsulation layer 132, and a second inorganic encapsulation layer 133, which are sequentially stacked. The first inorganic encapsulation layer 131 and the second inorganic encapsulation layer 133 may include one or more inorganic insulating materials, such as $SiO_2$, $SiN_x$, a silicon oxynitride ($Si_xN_y$), $Al_2O_3$, $TiO_2$, $Ta_2O_5$, $HfO_2$, or the like. The organic encapsulation layer 132 may include a polymer-based material. The polymer-based material may include silicon-based resin, acrylic resin, epoxy-based resin, polyimide, polyethylene, or the like.

In another embodiment, the sealing substrate may be arranged to face the substrate 100 with the display elements therebetween. As the substrate 100 and the sealing substrate are coupled to each other by a sealing member, an inner space between the substrate 100 and the sealing substrate may be hermetically sealed. The sealing substrate may be a flexible substrate. The sealing member may be a sealant, and in another embodiment, the sealing member may include a material that is cured by laser. For example, the sealing member may be frit.

The touch sensor layer TSL may obtain coordinates information according to an external input, for example, a touch event. The touch sensor layer TSL may include a touch electrode and sensing lines connected to the touch electrode. The touch sensor layer TSL may sense the external input in a self-capacitance method or a mutual capacitance method. The touch sensor layer TSL may be formed on the thin film encapsulation layer TFEL. Alternatively, the touch sensor layer TSL may be separately formed on the touch substrate and then coupled to the thin film encapsulation layer TFEL through an adhesive layer, such as an optically clear adhesive ("OCA"). In an embodiment, the touch sensor layer TSL may be formed directly on the thin film encapsulation layer TFEL, and in this case, the adhesive layer may not be disposed between the touch sensor layer TSL and the thin film encapsulation layer TFEL.

The optical functional layer OFL may include an antireflective layer. The antireflective layer may reduce reflectivity of light (external light) input toward the display apparatus 11 from the outside. In some embodiments, the optical functional layer OFL may be a polarization film. In some embodiments, the optical functional layer OFL may be a filter support layer including a black matrix and color filters.

Figure 15:
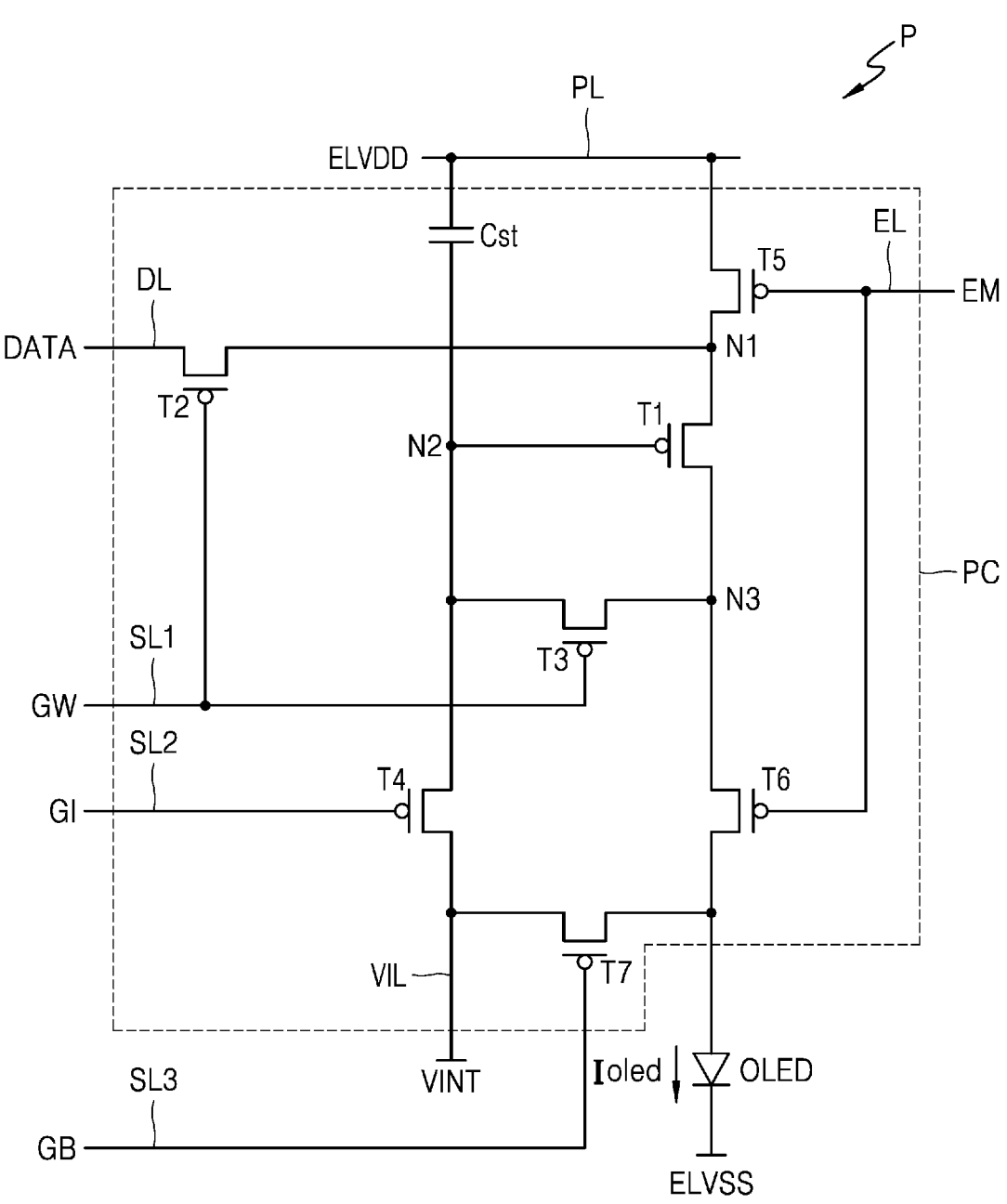
FIG. 15 is an equivalent circuit diagram of a pixel included in the display apparatus of FIG. 8.

FIG. 15 is an equivalent circuit diagram of a pixel included in the display apparatus 11 of FIG. 8.

Referring to FIG. 15, a pixel circuit PC may include the first to seventh transistors T1 to T7. According to the type (N-type or P-type) and/or the operation conditions of a transistor, a first terminal of the transistor may be a source electrode or a drain electrode, and a second terminal may be an electrode different from the first terminal. For example, when the first terminal is a source electrode, the second terminal may be a drain electrode.

The pixel circuit PC may be connected to a first scan line SL1 for transmitting a first scan signal GW, a second scan line SL2 for transmitting a second scan signal GI, a third scan line SL3 for transmitting a third scan signal GB, an emission control line EL for transmitting an emission control signal EM, a data line DL for transmitting a data signal DATA, a driving voltage line PL for transmitting a driving voltage ELVDD, and an initialization voltage line VIL for transmitting an initialization voltage VINT. The pixel circuit PC may be connected to an organic LED OLED as the display element.

The first transistor T1 may be connected between the driving voltage line PL and the organic LED OLED. The first transistor T1 may be connected between a first node N1 and a third node N3. The first transistor T1 may be connected to the driving voltage line PL via the fifth transistor T5, and may be electrically connected to the organic LED OLED via the sixth transistor T6. The first transistor T1 may include a gate electrode connected to a second node N2, a first terminal connected to the first node N1, and a second terminal connected to the third node N3. The driving voltage line PL may transmit the driving voltage ELVDD to the first transistor T1. The first transistor T1 may serve as a driving transistor, and receive the data signal DATA according to a switching operation of the second transistor T2 and supply a driving current Ioled to the organic LED OLED.

The second transistor (or a data write transistor) T2 may be connected between the data line DL and the first node N1. The second transistor T2 may be connected to the driving voltage line PL via the fifth transistor T5. The second transistor T2 may include a gate electrode connected to the first scan line SL1, a first terminal connected to the data line DL, and a second terminal connected to the first node N1. The second transistor T2 may be turned on in response to the first scan signal GW received via the first scan line SL1 to perform a switching operation of transmitting the data signal DATA received via the data line DL to the first node N1.

The third transistor (or a compensation transistor) T3 may be connected between the second node N2 and the third node N3. The third transistor T3 may be connected to the organic LED OLED via the sixth transistor T6. The third transistor T3 may include a gate electrode connected to the first scan line SL1, a first terminal connected to the second node N2, and a second terminal connected to the third node N3. The third transistor T3 may be turned on in response to the first scan signal GW received via the first scan line SL1 to diode-connect the first transistor T1, thereby compensating for a threshold voltage of the first transistor T1.

The fourth transistor (or a first initialization transistor) T4 may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be turned on in response to the second scan signal GI received via the second scan line SL2 to transmit the initialization voltage VINT to the gate electrode of the first transistor T1, thereby initializing the gate electrode of the first transistor T1.

The fifth transistor (or a first emission control transistor) T5 may be connected between the driving voltage line PL and the first node N1. The sixth transistor (or a second emission control transistor) T6 may be connected between the third node N3 and the organic LED OLED. The fifth transistor T5 may include a gate electrode connected to the emission control line EL, a first terminal connected to the driving voltage line PL, and a second terminal connected to the first node N1. The sixth transistor T6 may include a gate electrode connected to the emission control line EL, a first terminal connected to the third node N3, and a second terminal connected to a pixel electrode of the organic LED OLED. The fifth transistor T5 and the sixth transistor T6 may be simultaneously turned on in response to the emission control signal EM received via the emission control line EL so that the driving current Ioled flows in the organic LED OLED.

The seventh transistor (or a second initialization transistor) T7 may be connected between the organic LED OLED and the initialization voltage line VIL. The seventh transistor T7 may include a gate electrode connected to the third scan line SL3, a first terminal connected to the second terminal of the sixth transistor T6 and the pixel electrode of the organic LED OLED, and a second terminal connected to the initialization voltage line VIL. The seventh transistor T7 may be turned on in response to the third scan signal GB received via the third scan line SL3 to transmit the initialization voltage VINT to the pixel electrode of the organic LED OLED, thereby initializing the pixel electrode of the organic LED OLED.

A capacitor Cst may include a first electrode connected to the gate electrode of the first transistor T1 and a second electrode connected to the driving voltage line PL. The capacitor Cst may maintain a voltage applied to the gate electrode of the first transistor T1 by storing and maintaining a voltage corresponding to a difference in voltage at both ends of the driving voltage line PL and the gate electrode of the first transistor T1.

The organic LED OLED may include a pixel electrode (a first electrode or an anode) and a counter electrode (a second electrode or a cathode), and the counter electrode may receive a common voltage ELVSS. The organic LED OLED may receive the driving current Ioled from the first transistor T1 and emit light to display an image.

FIG. 15 illustrates that the first to seventh transistors T1 to T7 are P-type transistors. However, the disclosure is not limited thereto. For example, the first to seventh transistors T1 to T7 may be N-type transistors, or some of the first to seventh transistors T1 to T7 may be N-type transistors and the other transistors may be P-type transistors. For example, among the first to seventh transistors T1 to T7, the third transistor T3 and the fourth transistor T4 may be N-type transistors, and the other transistors may be P-type transistors. The third transistor T3 and the fourth transistor T4 may each include a semiconductor layer including an oxide, and the other transistors may include a semiconductor layer including silicon.

In the present embodiment, a case in which an organic light-emitting diode is employed as a display element is exemplified, whereas in another embodiment, an inorganic light-emitting element or a quantum-dot light-emitting element may be employed as a display element.

Figure 16:
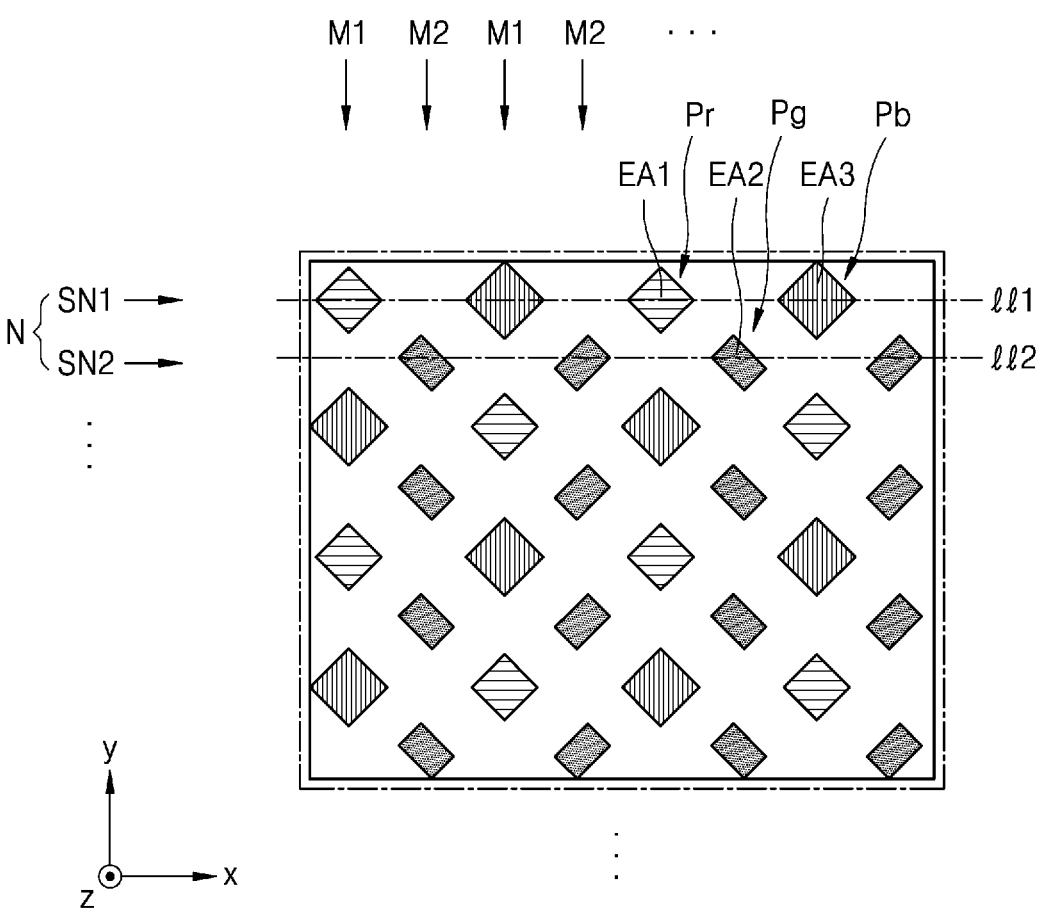
FIG. 16 is a view schematically showing emission areas of a plurality of pixels arranged in a display area, according to an embodiment.

FIG. 16 is a view schematically showing emission areas of a plurality of pixels arranged in a display area, according to an embodiment.

Referring to FIG. 16, a plurality of pixels arranged in the display area DDA may include a first sub-pixel Pr that emits light of a first color, a second sub-pixel Pg that emits light of a second color, and a third sub-pixel Pb that emits light of a third color. In an embodiment, the first sub-pixel Pr may be a red pixel that emits red light, the second sub-pixel Pg may be a green pixel that emits green light, and the third sub-pixel Pb may be a blue pixel that emits blue light.

In the first display area DDA1 and the second display area DDA2, the first sub-pixel Pr, the second sub-pixel Pg, and the third sub-pixel Pb may be repeatedly arranged in a certain pattern in the ±x directions and ±y directions. The first sub-pixel Pr, the second sub-pixel Pg, and the third sub-pixel Pb may each include a pixel circuit and a display element electrically connected to the pixel circuit. In an embodiment, the display element may be the organic LED OLED.

The emission areas of the first sub-pixel Pr, the second sub-pixel Pg, and the third sub-pixel Pb are where the light-emitting layer of the organic LED OLED is disposed. The emission area may be defined by an opening of the pixel defining layer.

In a first column M1, a first emission area EA1 of the first sub-pixel Pr and a third emission area EA3 of the third sub-pixel Pb may be alternately arranged in the ±y directions. In a second column M2, a second emission area EA2 of the second sub-pixel Pg may be repeatedly arranged in the ±y directions. The first column M1 and the second column M2 may alternate in the ±x directions, and the first emission area EA1 of the first sub-pixel Pr and the third emission area EA3 of the third sub-pixel Pb in the first columns M1 neighboring each other may be arranged opposite to each other.

The first emission area EA1 of the first sub-pixel Pr and the third emission area EA3 of the third sub-pixel Pb may be alternately arranged in the ±x directions in a first sub-row SN1 of each row N along a first virtual line ll1, and the second emission area EA2 of the second sub-pixel Pg may be repeatedly arranged in the ±x directions in a second sub-row SN2 along a second virtual line ll2. In other words, the first emission area EA1 of the first sub-pixel Pr, the second emission area EA2 of the second sub-pixel Pg, the third emission area EA3 of the third sub-pixel Pb, and the second emission area EA2 of the second sub-pixel Pg may be repeatedly arranged zigzag in each row N.

The first emission area EA1 of the first sub-pixel Pr, the second emission area EA2 of the second sub-pixel Pg, and the third emission area EA3 of the third sub-pixel Pb may have different sizes. In an embodiment, the third emission area EA3 of the third sub-pixel Pb may have a size greater than the first emission area EA1 of the first sub-pixel Pr. Furthermore, the third emission area EA3 of the third sub-pixel Pb may have a size greater than the second emission area EA2 of the second sub-pixel Pg. The first emission area EA1 of the first sub-pixel Pr may have a size greater than the second emission area EA2 of the second sub-pixel Pg. In another embodiment, the third emission area EA3 of the third sub-pixel Pb may have the same size as the first emission area EA1 of the first sub-pixel Pr. However, the disclosure is not limited thereto. For example, various embodiments are available, in which the first emission area EA1 of the first sub-pixel Pr is larger than the second emission area EA2 of the second sub-pixel Pg and the third emission area EA3 of the third sub-pixel Pb, or the like.

The first to third emission areas EA1, EA2, and EA3 may have various shapes, such as a polygon such as a rectangle, an octagon, or the like, circular, oval, or the like, and the polygon may have a shape with a rounded corner (or a vertex).

Figure 17:
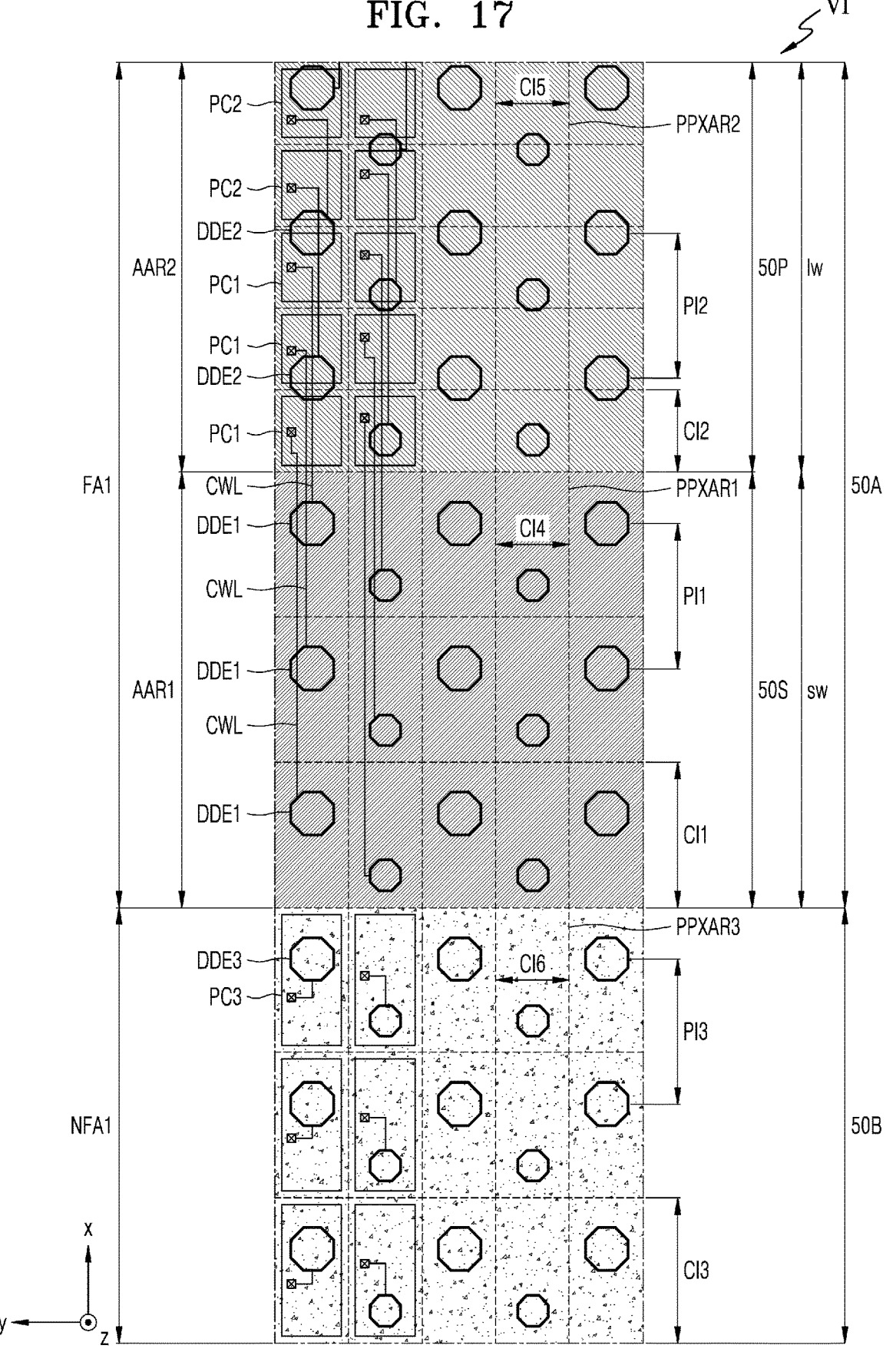
FIG. 17 is an exemplary enlarged plan view of a region VI of FIG. 8.

FIG. 17 is an exemplary enlarged plan view of region VI of FIG. 8. FIG. 17 illustrates the connection between a pixel circuit and a display element in a folding area and a non-folding area, according to an embodiment. Although, in FIG. 17, the first folding area FA1 and the first non-folding area NFA1 are mainly described, the descriptions may be identically applied to the second folding area FA2, the second non-folding area NFA2, and the third non-folding area NFA3.

Referring to FIG. 17, the display area DDA of the display panel 10 may include the first folding area FA1 and the first non-folding area NFA1. The first folding area FA1 may correspond to or overlap the first support portion 50A of the support layer 50. The first non-folding area NFA1 may correspond to or overlap the second support portion 50B of the support layer 50. The first folding area FA1 may include the first area AAR1 and the second area AAR2. The first area AAR1 may correspond to or overlap the slit 50S of the first support portion 50A of the support layer 50. The second area AAR2 may correspond to or overlap the rib 50P of the first support portion 50A of the support layer 50. The first area AAR1 may have a size corresponding to the width sw of the slit 50S of the support layer 50, and the second area AAR2 may have a size corresponding to the width lw of the rib 50P of the support layer 50. For example, the length of the first area AAR1 in the first direction, for example, ±x directions, may correspond to the width sw of the slit 50S of the support layer 50, and the length of the second area AAR2 in the first direction, for example, ±x directions, may correspond to the width lw of the rib 50P of the support layer 50.

The display area DDA of the display panel 10 may include a plurality of pixel areas. For example, the first area AAR1 of the first folding area FA1 may include the first pixel areas PPXAR1. The second area AAR2 of the first folding area FA1 may include the second pixel areas PPXAR2. The first non-folding area NFA1 may include the third pixel areas PPXAR3. The pixel areas may be repeated in the first direction, for example, ±x directions, and in the second direction, for example, ±y directions.

In an embodiment, the first pixel areas PPXAR1 may be arranged in the first direction, for example, ±x directions, at the first pitch CI1. The second pixel areas PPXAR2 may be arranged in the first direction, for example, ±x directions, at the second pitch CI2 different from the first pitch CI1. For example, the second pitch CI2 may be less than the first pitch CI1.

In an embodiment, the third pixel areas PPXAR3 may be arranged in the first direction, for example, ±x directions, at the third pitch CI3. The third pitch CI3 may be substantially the same as the first pitch CI1.

In an embodiment, the first pixel areas PPXAR1 may be arranged in the second direction, for example, ±y directions, at a fourth pitch CI4. The second pixel areas PPXAR2 may be arranged in the second direction, for example, ±y directions, at a fifth pitch CI5. The third pixel areas PPXAR3 may be arranged in the second direction, for example, ±y directions, at a sixth pitch CI6. The fourth pitch CI4, the fifth pitch CI5, and the sixth pitch CI6 may be substantially identical.

In some pixel areas, a pixel circuit of a pixel may be disposed. For example, the first pixel circuits PC1 may be arranged in some areas of the second pixel areas PPXAR2, respectively. The second pixel circuits PC2 may be arranged in some other areas of the second pixel areas PPXAR2, respectively. The third pixel circuits PC3 may be arranged in the third pixel areas PPXAR3, respectively. Pixel circuits may not be arranged in the first area AAR1 of the first folding area FA1 corresponding to the slit 50S of the support layer 50.

In a comparative example, pixel circuits may be disposed on a substrate corresponding to a slit of a support layer. In this case, when an external impact is applied to a display apparatus, the external impact may directly arrive at a pixel circuit on a substrate by passing through a slit of a support layer. The pixel circuit may be damaged by the external impact, and thus, a display element connected to the pixel circuit may not be normally driven.

In contrast, according to an embodiment, pixel circuits may not be arranged in the first area AAR1 of the first folding area FA1 corresponding to the slit 50S of the support layer 50. In this case, even when an external impact arrives at the display panel 10 by passing through the slit 50S of the support layer 50, as there is no pixel circuit overlapping the slit 50S of the support layer 50, a defective pixel circuit due to the external impact may be effectively prevented or reduced.

In an embodiment, a pitch between the first pixel circuits PC1 neighboring each other in the first direction, for example, ±x directions, and a pitch between the second pixel circuits PC2 neighboring each other in the first direction, for example, ±x directions, may be less than a pitch between the third pixel circuits PC3 neighboring each other in the first direction, for example, ±x directions. The arrangements of the first pixel circuits PC1 and the second pixel circuits PC2 in the first direction, for example, ±x directions, and/or the second direction, for example, ±y directions, may be different from the arrangement of the third pixel circuits PC3 in the first direction, for example, ±x directions, and/or the second direction, for example, ±y directions. Accordingly, the sizes of the first pixel circuit PC1 and the second pixel circuit PC2 in the first direction, for example, ±x directions, may be reduced from the size of the third pixel circuit PC3 in the first direction, for example, ±x directions.

Signal lines connected to a pixel circuit may be disposed in a pixel area. For example, the first scan line SL1, the second scan line SL2, the third scan line SL3, the emission control line EL, the data line DL, the driving voltage line PL, the initialization voltage line VIL, or the like of FIG. 15 may be disposed in a pixel area.

A display element may be disposed on a layer above a pixel circuit. The display element may be arranged directly above a pixel circuit connected thereto to overlap each other, or arranged to partially overlap a pixel circuit of another pixel arranged in an adjacent row and/or column offset from the pixel circuit. Alternatively, the display element may be arranged not to overlap the connected pixel circuit. For example, the first display elements DDE1 may be arranged in the first area AAR1 of the first folding area FA1, the second display elements DDE2 may be arranged in the second area AAR2 of the first folding area FA1, and the third display elements DDE3 may be arranged in the first non-folding area NFA1. The first display elements DDE1 may be electrically connected to the first pixel circuits PC1, respectively, arranged in the second area AAR2 of the first folding area FA1 via the connection lines CWL. The first display elements DDE1 may not overlap the first pixel circuits PC1. The second display elements DDE2 may be electrically connected to the second pixel circuits PC2 arranged in the second area AAR2 of the first folding area FA1, respectively. The second display element DDE2 may be arranged directly above the second pixel circuit PC2 connected thereto to overlap each other, or arranged to at least partially overlap another second pixel circuit PC2 or the first pixel circuit PC1 arranged in an adjacent row and/or column offset from the second pixel circuit PC2 connected thereto. The third display elements DDE3 may be electrically connected to the third pixel circuits PC3 arranged in the first non-folding area NFA1, respectively. The third display element DDE3 may be arranged directly above the third pixel circuit PC3 connected thereto, or arranged to at least partially overlap another third pixel circuit PC3 arranged in an adjacent row and/or column offset from the third pixel circuit PC3 connected thereto.

In an embodiment, the number of the first display elements DDE1 arranged in the first area AAR1 of the first folding area FA1, in the first direction, for example, ±x directions, may be determined based on the width sw of the slit 50S of the support layer 50, and the number of the second display elements DDE2 arranged in the second area AAR2 of the first folding area FA1 in the first direction, for example, ±x directions, may be determined based on the width lw of the rib 50P of the support layer 50.

In an embodiment, a first gap PI1 between the first display elements DDE1 neighboring each other in the first direction, for example, ±x directions, among the first display elements DDE1 may be substantially the same as a second gap PI2 between the second display elements DDE2 neighboring each other in the first direction, for example, ±x directions, among the second display elements DDE2. The first gap PI1 between the first display elements DDE1 neighboring each other in the first direction, for example, ±x directions, among the first display elements DDE1 may be substantially the same as a third gap PI3 between the third display elements DDE3 neighboring each other in the first direction, for example, ±x directions, among the third display elements DDE3.

FIG. 18 is an exemplary enlarged plan view of region VI of FIG. 8. FIG. 18 illustrates an insulating layer and a pixel separation film in a folding area and a non-folding area, according to an embodiment. Although, in FIG. 18, the first folding area FA1 and the first non-folding area NFA1 are mainly described, the descriptions may be identically applied to the second folding area FA2, the second non-folding area NFA2, and the third non-folding area NFA3. Throughout FIG. 18 and FIG. 17, like reference numerals denote like elements, and thus, redundant descriptions thereof are omitted.

Referring to FIG. 18, the display panel 10 may include a first insulating layer IIL1 and first to third pixel separation films PPSL1, PPSL2, and PPSL3.

The first insulating layer IIL1 may define first to third trenches ttr1, ttr2, and ttr3 therein. The first trenches ttr1 may correspond to the boundaries of the first pixel areas PPXAR1 neighboring each other, respectively, in the first direction, for example, ±x directions, among the first pixel areas PPXAR1, the second trenches ttr2 may correspond to the boundaries of the second pixel areas PPXAR2 neighboring each other, respectively, in the first direction, for example, ±x directions, among the second pixel areas PPXAR2, and the third trenches ttr3 may correspond to the boundaries of the third pixel areas PPXAR3 neighboring each other in the first direction, respectively, for example, ±x directions, among the third pixel areas PPXAR3.

The first pixel separation films PPSL1 may be buried in the first trenches ttr1, respectively, the second pixel separation films PPSL2 may be buried in the second trenches ttr2, respectively, and the third pixel separation films PPSL3 may be buried in the third trenches ttr3, respectively.

Although, in FIG. 18, the trenches corresponding to the boundaries of pixel areas neighboring each other in the first direction, for example, ±x directions, respectively, and the pixel separation films buried in the trenches, respectively, as described above with reference to FIG. 2, the first insulating layer IIL1 may have trenches corresponding to the boundaries of pixel areas neighboring each other in the second direction, for example, ±y directions. The pixel separation films may be buried in the trenches, respectively. As illustrated in FIG. 18, a pixel area may be entirely surrounded by the pixel separation films. In another embodiment, a pixel area may be partially surrounded by the pixel separation films.

In an embodiment, a first gap dd1 between the first pixel separation films PPSL1 neighboring each other in the first direction, for example, ±x directions, among the first pixel separation films PPSL1 may be different from a second gap dd2 between the second pixel separation films PPSL2 neighboring each other in the first direction, for example, ±x directions, among the second pixel separation films PPSL2. For example, the first gap dd1 may be greater than the second gap dd2.

In an embodiment, the first gap dd1 between the first pixel separation films PPSL1 neighboring each other in the first direction, for example, ±x directions, among the first pixel separation films PPSL1 may be substantially the same as a third gap dd3 between the third pixel separation films PPSL3 neighboring each other in the first direction, for example, ±x directions, among the third pixel separation films PPSL3.

In an embodiment, the first to third pixel separation films PPSL1, PPSL2, and PPSL3 may each include a material different from the first insulating layer IIL1. For example, the first insulating layer IIL1 may include an inorganic material, and the first to third pixel separation films PPSL1, PPSL2, and PPSL3 may each include an organic material. As each of the first to third pixel separation films PPSL1, PPSL2, and PPSL3 includes an organic material, cracks formed in the first insulating layer IIL1 including an inorganic material in a pixel effectively may be prevented or reduced from growing into an adjacent pixel by an external impact.

Figure 19:
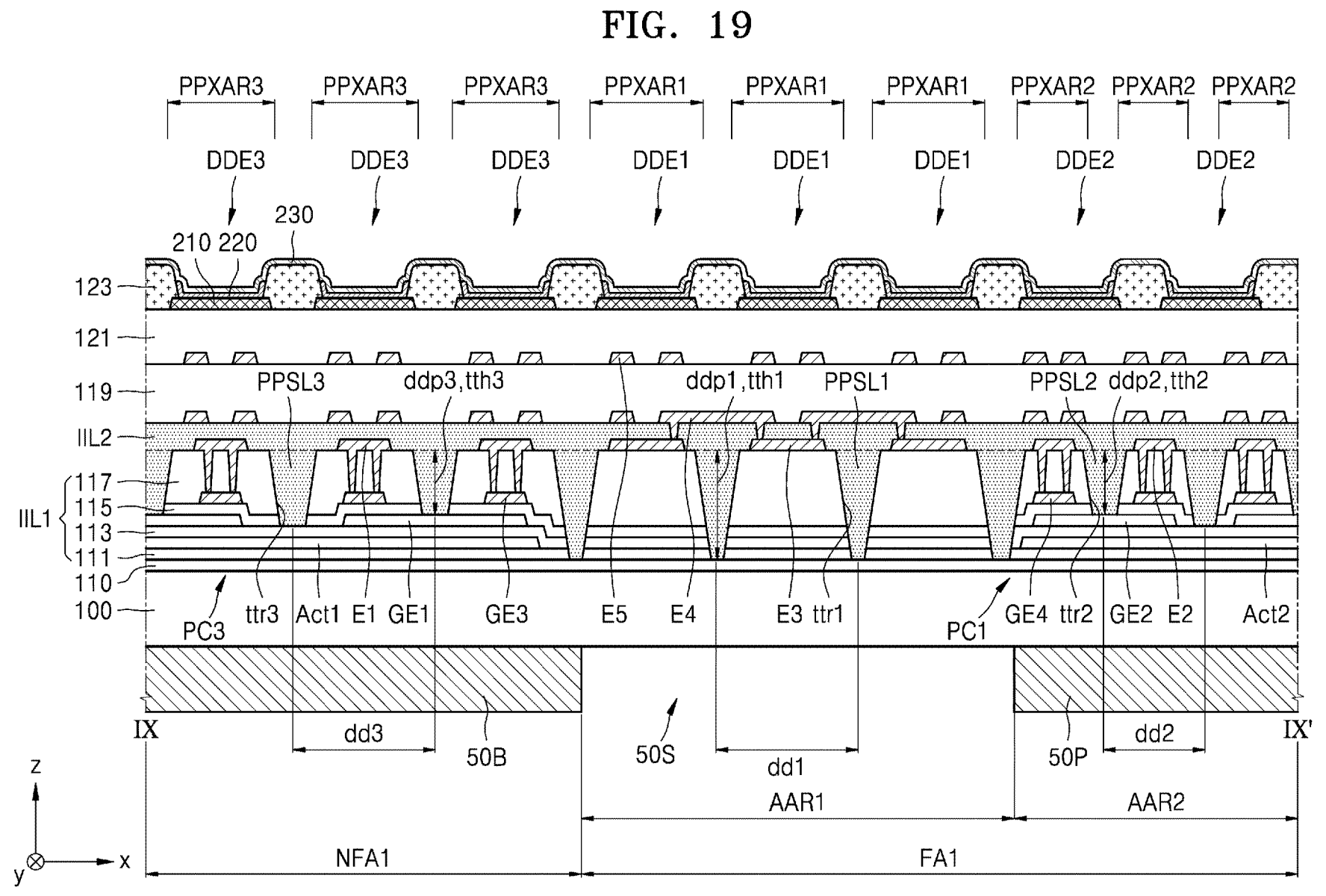

FIG. 19 is an exemplary cross-sectional view of a portion of the display apparatus 11 of FIG. 18 taken along line IX-IX'. Although, in FIG. 19, the first folding area FA1 and the first non-folding area NFA1 are mainly described, the descriptions may be identically applied to the second folding area FA2, the second non-folding area NFA2, and the third non-folding area NFA3.

Referring to FIG. 19, the display apparatus 11 may include the display panel 10 and the support layer 50. The display panel 10 may include the first folding area FA1 corresponding to the first support portion 50A of the support layer 50, and the first non-folding area NFA1 corresponding to the second support portion 50B of the support layer 50. The first folding area FA1 may include the first area AAR1 corresponding to the slit 50S of the first support portion 50A of the support layer 50, and the second area AAR2 corresponding to the rib 50P of the first support portion 50A of the support layer 50.

The first area AAR1 of the first folding area FA1 may include the first pixel areas PPXAR1, the second area AAR2 of the first folding area FA1 may include the second pixel areas PPXAR2, and the first non-folding area NFA1 may include the third pixel areas PPXAR3. As described above with reference to FIG. 17, the first pixel circuits PC1 or the second pixel circuits PC2 may be arranged in the second pixel areas PPXAR2, respectively. The third pixel circuits PC3 may be arranged in the third pixel areas PPXAR3, respectively. The first display elements DDE1 electrically connected to the first pixel circuits PC1, respectively, may be arranged in the first area AAR1 of the first folding area FA1, the second display elements DDE2 electrically connected to the second pixel circuits PC2, respectively, may be arranged in the second area AAR2 of the first folding area FA1, and the third display elements DDE3 electrically connected to the third pixel circuits PC3, respectively, may be arranged in the first non-folding area NFA1.

Pixel circuits may not be arranged in the first pixel areas PPXAR1, and signal lines connected to the pixel circuit may be arranged in the first pixel areas PPXAR1. For example, third electrodes E3 may be arranged in the first pixel areas PPXAR1, respectively, and the third electrodes E3 may be connected to each other via fourth electrodes E4. The third and fourth electrodes E3 and E4 may correspond to the first scan line SL1, the second scan line SL2, the third scan line SL3, the emission control line EL, the data line DL, the driving voltage line PL, the initialization voltage line VIL, or the like of FIG. 15.

Each of the first to third pixel circuits PC3 may include a semiconductor layer, a gate electrode, an electrode, or the like. For example, the first pixel circuit PC1 may include a second semiconductor layer Act2, a second gate electrode GE2, a fourth gate electrode GE4, and a second electrode E2, and the third pixel circuit PC3 may include a first semiconductor layer Act1, a first gate electrode GE1, a third gate electrode GE3, and a first electrode E1. The above descriptions about the first pixel circuit PC1 and the third pixel circuit PC3 may be identically applied to the second pixel circuit PC2.

In an embodiment, adjacent pixel circuits may share a gate electrode with each other. For example, the first pixel circuits PC1 adjacent to each other may share the second gate electrode GE2 with each other, and the third pixel circuits PC3 adjacent to each other may share the first gate electrode GE1 with each other. The above descriptions about the first pixel circuit PC1 and the third pixel circuit PC3 may be identically applied to the second pixel circuit PC2.

The display panel 10 may include the first insulating layer IIL1. The first insulating layer IIL1 may include a buffer layer 111, a first gate insulating layer 113, a second gate insulating layer 115, and an interlayer insulating layer 117. The first insulating layer IIL1 may have the first trench ttr1 corresponding to the boundaries between the first pixel areas PPXAR1 adjacent to each other, the second trench ttr2 corresponding to the boundaries between the second pixel areas PPXAR2 adjacent to each other, and the third trench ttr3 corresponding to boundaries between the third pixel areas PPXAR3 adjacent to each other.

In an embodiment, a first depth ddp1 of the first trench ttr1 along the thickness direction, for example, ±z directions, of the substrate 100 may be different from a second depth ddp2 of the second trench ttr2 along the thickness direction, for example, ±z directions, of the substrate 100. For example, the first depth ddp1 may be greater than the second depth ddp2. The first depth ddp1 of the first trench ttr1 along the thickness direction, for example, ±z directions, of the substrate 100 may be different from a third depth ddp3 of the third trench ttr3 along the thickness direction, for example, ±z directions, of the substrate 100. For example, the first depth ddp1 may be greater than the third depth ddp3. The second depth ddp2 of the second trench ttr2 along the thickness direction, for example, ±z directions, of the substrate 100 may be substantially the same as the third depth ddp3 of the third trench ttr3 along the thickness direction, for example, ±z directions, of the substrate 100.

The first trench ttr1 may be formed in the buffer layer 111, the first gate insulating layer 113, the second gate insulating layer 115, and the interlayer insulating layer 117, and the second trench ttr2 and the third trench ttr3 may be formed in the second gate insulating layer 115 and the interlayer insulating layer 117.

The first to third pixel separation films PPSL1, PPSL2, and PPSL3 may be arranged in the first to third trenches ttr1, ttr2, and ttr3, respectively. In other words, the first to third pixel separation films PPSL1, PPSL2, and PPSL3 may be buried in the first to third trenches ttr1, ttr2, and ttr3, respectively. As the first to third pixel separation films PPSL1, PPSL2, and PPSL3 are arranged in the first to third trenches ttr1, ttr2, and ttr3, respectively, steps of the first insulating layer IIL1 generated by the first to third trenches ttr1, ttr2, and ttr3 may be effectively removed or reduced.

In an embodiment, the first gap dd1 between the first pixel separation films PPSL1 adjacent to each other may be different from the second gap dd2 between the second pixel separation films PSL2 adjacent to each other. For example, the first gap dd1 may be greater than the second gap dd2. The third gap dd3 between the third pixel separation films PPSL3 adjacent to each other may be different from the second gap dd2 between the second pixel separation films PSL2 adjacent to each other. For example, the third gap dd3 may be greater than the second gap dd2. The first gap dd1 between the first pixel separation films PPSL1 adjacent to each other may be substantially the same as the third gap dd3 between the third pixel separation films PPSL3 adjacent to each other.

In an embodiment, a first thickness tth1 of the first pixel separation film PPSL1 along the thickness direction, for example, ±z directions, of the substrate 100 may be different from a second thickness tth2 of the second pixel separation film PPSL2 along the thickness direction, for example, ±z directions, of the substrate 100. For example, the first thickness tth1 may be greater than the second thickness tth2. The first thickness tth1 of the first pixel separation film PPSL1 along the thickness direction, for example, ±z directions, of the substrate 100 may be different from the third thickness tth3 of the third pixel separation film PPSL3 along the thickness direction, for example, ±z directions, of the substrate 100. For example, the first thickness tth1 may be greater than the third thickness tth3. The second thickness tth2 of the second pixel separation film PPSL2 along the thickness direction, for example, ±z directions, of the substrate 100 may be substantially the same as the third thickness tth3 of the third pixel separation film PPSL3 along the thickness direction, for example, ±z directions, of the substrate 100.

The structure included in the display apparatus 11 is described below in detail according to a stack structure with reference to FIG. 19.

The support layer 50 may include at least one of glass, plastic, and metal. In an embodiment, the support layer 50 may include polyurethane or carbon fiber reinforced plastic. In an embodiment, the support layer 50 may include at least one of stainless steel, invar, Ni, Co, a Ni alloy, and a Ni—Co alloy. In an embodiment, the support layer 50 may include austenitic stainless steels.

The substrate 100 on the support layer 50 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including polymer resin may be flexible, rollable, or bendable. The substrate 100 may have a multilayer structure of a layer including polymer resin described above and an inorganic layer.

The barrier layer 110 may be disposed on the substrate 100. The barrier layer 110 may serve to prevent or reduce infiltration of impurities from the substrate 100 or the like into the first and second semiconductor layers Act1 and Act2. The barrier layer 110 may include an inorganic material, such as an oxide or a nitride, an organic material, or an organic/inorganic composite, and may have a single layer or multilayer structure of an inorganic material and an organic material.

The first insulating layer IIL1 may be disposed on the barrier layer 110. The first insulating layer IIL1 may include $SiO_2$, $SiN_x$, SiON, $Al_2O_3$, $TiO_2$, $Ta_2O_5$, $HfO_2$, $ZnO_2$, or the like.

The first to third pixel separation films PPSL1, PPSL2, and PPSL3 arranged in the first to third trenches ttr1, ttr2, and ttr3 of the first insulating layer IIL1, respectively, may each be formed in a single layer or multilayer of a film including an organic material. For example, the first to third pixel separation films PPSL1, PPSL2, and PPSL3 may include general purpose polymers, such as BCB, polyimide, HMDSO, PMMA, or PS, polymer derivatives having a phenolic group, acrylic polymers, imide-based polymers, aryl ether-based polymers, amide-based polymers, fluorine-based polymers, p-xylene-based polymers, vinyl alcohol-based polymers, blends thereof, or the like.

The first and second semiconductor layers Act1 and Act2 may be disposed on the buffer layer 111. The first and second semiconductor layers Act1 and Act2 may each include amorphous silicon or polysilicon. In another embodiment, the first and second semiconductor layers Act1 and Act2 may each include at least one oxide selected from among In, Ga, Sn, Zr, V, Hf, Cd, Ge, Cr, Ti, Al, Cs, Ce, and Zn.

The first and second semiconductor layers Act1 and Act2 may each include a channel region, and a source region and a drain region arranged at both sides of the channel region. The first and second semiconductor layers Act1 and Act2 may each be formed in a single layer or a multilayer.

The first gate insulating layer 113 may be disposed on the buffer layer 111 to cover the first and second semiconductor layers Act1 and Act2. The first and second gate electrodes GE1 and GE2 may be disposed on the first gate insulating layer 113. The first and second gate electrodes GE1 and GE2 may include a conductive material including Mo, Al, Cu, Ti, or the like, and may be formed in a single layer or multilayer including the above materials. As an example, the first and second gate electrodes GE1 and GE2 may be a single layer of Mo.

The second gate insulating layer 115 may be disposed on the first gate insulating layer 113 to cover the first and second gate electrodes GE1 and GE2. The third and fourth gate electrodes GE3 and GE4 may be disposed on the second gate insulating layer 115. The third and fourth gate electrodes GE3 and GE4 may include a conductive material including Mo, Al, Cu, Ti, or the like, and may be formed in a single layer or multilayer including the above materials. As an example, the third and fourth gate electrodes GE3 and GE4 may be a single layer of Mo.

The interlayer insulating layer 117 may be disposed on the second gate insulating layer 115 to cover the third and fourth gate electrodes GE3 and GE4. The first to third electrodes E1, E2, and E3 may be disposed on the interlayer insulating layer 117. The first and second electrodes E1 and E2 may be connected to gate electrodes via at least one contact hole formed in the interlayer insulating layer 117. The first to third electrodes E1, E2, and E3 may each include a conductive material including Mo, Al, Cu, Ti, or the like, and may be formed in a single layer or multilayer including the above materials. As an example, the first to third electrodes E1, E2, and E3 may have a multilayer structure of Ti/Al/Ti.

A second insulating layer IIL2 may be disposed on the interlayer insulating layer 117 to cover the first to third electrodes E1, E2, and E3. The second insulating layer IIL2 may be formed in a single layer or multilayer of a film including an organic material, and may provide a flat upper surface. The second insulating layer IIL2 as above may include general purpose polymers, such as BCB, polyimide, HMDSO, PMMA, or PS, polymer derivatives having a phenolic group, acrylic polymers, imide-based polymers, aryl ether-based polymers, amide-based polymers, fluorine-based polymers, p-xylene-based polymers, vinyl alcohol-based polymers, blends thereof, or the like.

The fourth electrode E4 may be disposed on the second insulating layer IIL2. Some fourth electrodes E4 may be connected to the third electrode E3 via at least one contact hole formed in the second insulating layer IIL2. The fourth electrode E4 may include a conductive material including Mo, Al, Cu, Ti, or the like, and may be formed in a single layer or multilayer including the above materials. As an example, the fourth electrode E4 may have a multilayer structure of Ti/Al/Ti.

A third insulating layer 119 may be disposed on the second insulating layer IIL2 to cover the fourth electrode E4. The third insulating layer 119 may be formed in a single layer or multilayer of a film including an organic material, and may provide a flat upper surface. The third insulating layer 119 as above may include general purpose polymers, such as BCB, polyimide, HMDSO, PMMA, or PS, polymer derivatives having a phenolic group, acrylic polymers, imide-based polymers, aryl ether-based polymers, amide-based polymers, fluorine-based polymers, p-xylene-based polymers, vinyl alcohol-based polymers, blends thereof, or the like.

A fifth electrode E5 may be disposed on the third insulating layer 119. Although not illustrated in FIG. 19, the fifth electrode E5 may be connected to the fourth electrode E4 via at least one contact hole formed in the third insulating layer 119. The fifth electrode E5 may include a conductive material including Mo, Al, Cu, Ti, or the like, and may be formed in a single layer or multilayer including the above materials. As an example, the fifth electrode E5 may have a multilayer structure of Ti/Al/Ti.

A fourth insulating layer 121 may be disposed on the third insulating layer 119 to cover the fifth electrode E5. The fourth insulating layer 121 may be formed in a single layer or multilayer of a film including an organic material, and may provide a flat upper surface. The fourth insulating layer 121 as above may include general purpose polymers, such as BCB, polyimide, HMDSO, PMMA, or PS, polymer derivatives having a phenolic group, acrylic polymers, imide-based polymers, aryl ether-based polymers, amide-based polymers, fluorine-based polymers, p-xylene-based polymers, vinyl alcohol-based polymers, blends thereof, or the like.

The first to third display elements DDE1, DDE2, and DDE3 may be disposed on the fourth insulating layer 121. The first to third display elements DDE1, DDE2, and DDE3 may each include an organic LED OLED. The first to third display elements DDE1, DDE2, and DDE3 may each include a pixel electrode 210, an intermediate layer 220 including an organic light-emitting layer, and a counter electrode 230. Although not illustrated in FIG. 19, the first to third display elements DDE1, DDE2, and DDE3 may be connected to the fifth electrode E5 via at least one contact hole formed in the fourth insulating layer 121.

The pixel electrode 210 may be a (semi-)transmissive electrode or a reflective electrode. In some embodiments, the pixel electrode 210 may include a reflective layer including Ag, Mg, Al, Pt, Pd, Au, Ni, Nd, Ir, Cr, a compound thereof, or the like, and a transparent or semi-transparent electrode layer formed on the reflective layer. The transparent or semi-transparent electrode layer may include at least one material selected from among an indium tin oxide ("ITO"), an indium zinc oxide ("IZO"), a zinc oxide (ZnO), an indium oxide ($In_2O_3$), an indium gallium oxide ("IGO"), and an aluminum zinc oxide ("AZO"). In some embodiments, the pixel electrode 210 may include ITO/Ag/ITO.

In the display area DDA of the substrate 100, a pixel defining layer 123 may be disposed on the fourth insulating layer 121. The pixel defining layer 123 may cover edges of the pixel electrode 210, and have an opening that exposes a central portion of the pixel electrode 210. The emission area of each of the first to third display elements DDE1, DDE2, and DDE3 may be defined by the opening.

The pixel defining layer 123 may prevent generation of ark or the like in the edge of the pixel electrode 210 by increasing a distance between the edge of the pixel electrode 210 and the counter electrode 230 above the pixel electrode 210.

The pixel defining layer 123 may be formed of one or more organic insulating material selected from among polyimide, polyamide, acryl resin, benzocyclobutene, and phenol resin, in a method, such as spin coating or the like. The pixel defining layer 123 may include an organic insulating material. Alternatively, the pixel defining layer 123 may include an inorganic insulating material, such as a silicon nitride, a silicon oxynitride, or a silicon oxide. Alternatively, the pixel defining layer 123 may include an organic insulating material and an inorganic insulating material. In some embodiments, the pixel defining layer 123 may include a sun blocking material, and may be provided in black. The sun blocking material may include resin or paste including carbon black, carbon nanotube, or black dye, metal particles, for example, Ni, Al, Mo, and an alloy thereof, metal oxide particles, for example, a Cr oxide, metal nitride particles, for example, a Cr nitride, or the like. When the pixel defining layer 123 includes the sun blocking material, external light reflection by metal structures below the pixel defining layer 123 may be reduced.

The intermediate layer 220 may be arranged in the opening formed by the pixel defining layer 123, and may include an organic light-emitting layer. The organic light-emitting layer may include an organic material including a fluorescent or phosphorescent material that emits red, green, blue, or white light. The organic light-emitting layer may include a low molecular weight organic material or a polymer organic material, and below and above the organic light-emitting layer, a functional layer, such as a hole transport layer ("HTL"), a hole injection layer ("HIL"), an electron transport layer ("ETL"), an electron injection layer ("EIL") or the like, may be optionally further arranged.

The counter electrode 230 may be a transmissive electrode or a reflective electrode. In some embodiments, the counter electrode 230 may be a transparent or semi-transparent electrode, and may be formed as a metal thin film having a relatively small work function and including Li, Ca, LiF/Ca, LiF/Al, Al, Ag, Mg, or a compound thereof. Furthermore, a transparent conductive oxide ("TCO") film, such as ITO, IZO, ZnO, $In_2O_3$, or the like, may be further disposed on the metal thin film. The counter electrode 230 may be arranged across the display area DDA, and may be disposed on the intermediate layer 220 and the pixel defining layer 123. The counter electrode 230 may be integrally formed across the first to third display elements DDE1, DDE2, and DDE3 to correspond to the pixel electrodes 210.

As the display elements DDE1, DDE2, and DDE3 may be easily damaged by external moisture, oxygen, or the like, the display elements DDE1, DDE2, and DDE3 may be protected by covering the display elements DDE1, DDE2, and DDE3 with an encapsulation layer (not shown). The encapsulation layer may extend to at least a portion of the peripheral area PPA while covering the display area DDA. The encapsulation layer may include a first inorganic encapsulation layer, an organic encapsulation layer, and a second inorganic encapsulation layer.

Figure 20:
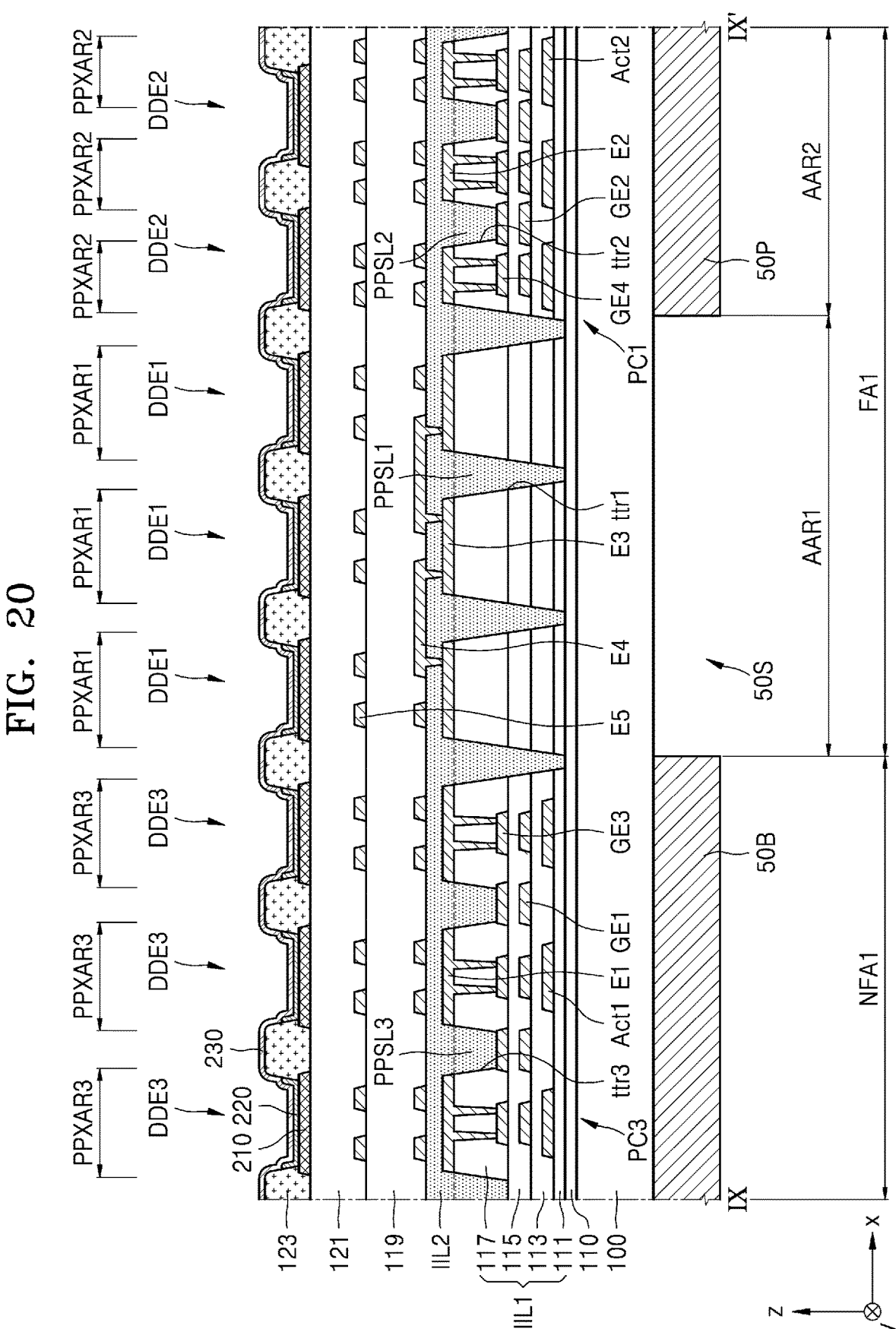
FIG. 20 is another exemplary cross-sectional view of a portion of the display apparatus of FIG. 18 taken along line IX-IX'.

FIG. 20 is another exemplary cross-sectional view of a portion of the display apparatus 11 of FIG. 18 taken along line IX-IX'. FIG. 20 illustrates a modified embodiment of FIG. 19 having a difference in the structure of a trench. In the following description, redundant descriptions with the embodiment of FIG. 19 are omitted, and only differences therebetween are described below.

Referring to FIG. 20, unlike FIG. 19 described above, the second and third trenches ttr2 and ttr3 may be formed in the interlayer insulating layer 117. The first pixel circuits PC1 adjacent to each other may share the fourth gate electrode GE4 with each other, and the third pixel circuits PC3 adjacent to each other may share the third gate electrode GE3 with each other. The above descriptions about the first pixel circuit PC1 and the third pixel circuit PC3 may be identically applied to the second pixel circuit PC2.

In an embodiment, as illustrated in FIG. 20, the side walls of the first insulating layer IIL1 that defines the first to third trenches ttr1, ttr2, and ttr3 may substantially match the edge of the third electrode E3.

Figure 21:
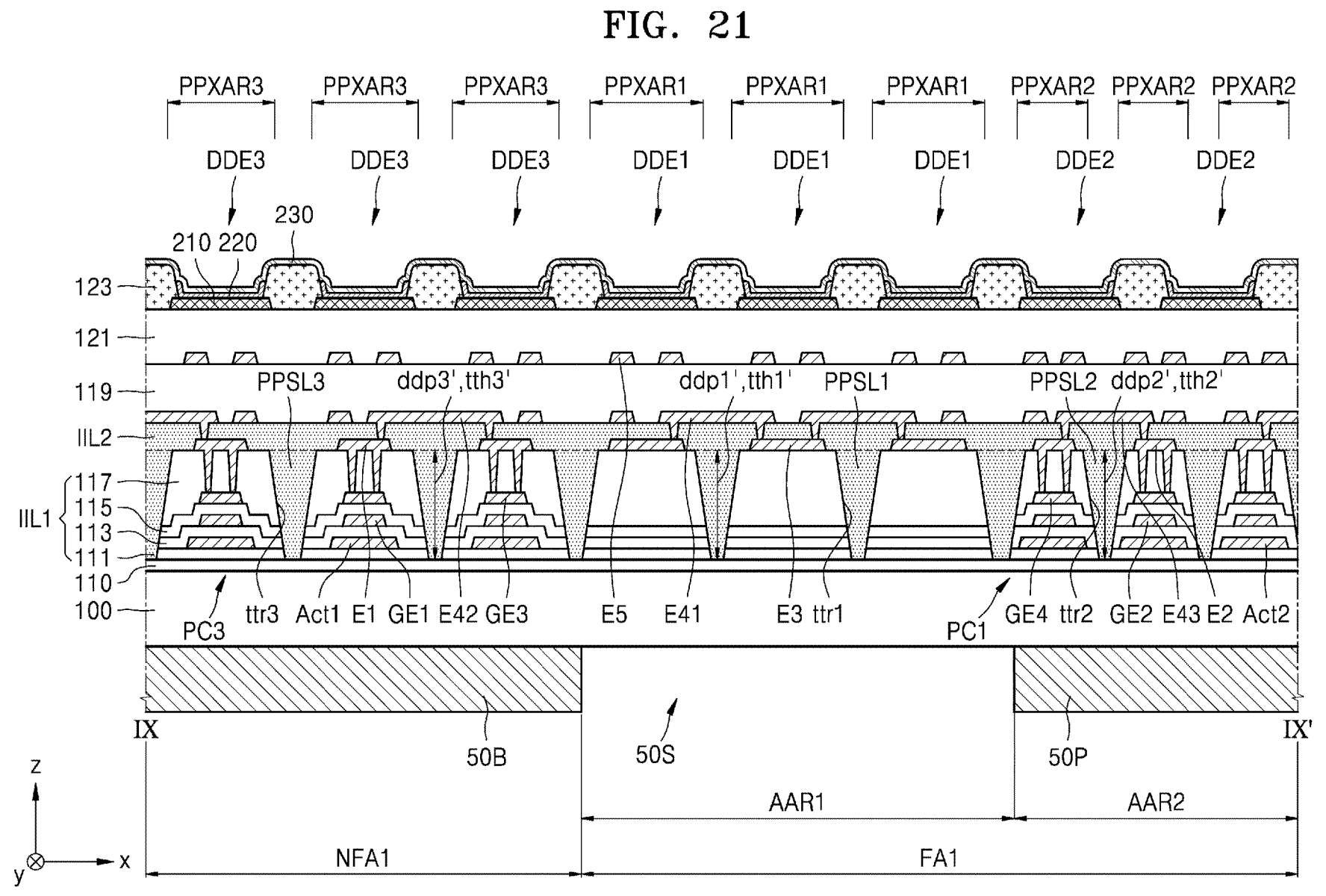

FIG. 21 is still another exemplary cross-sectional view of a portion of the display apparatus 11 of FIG. 18 taken along line IX-IX'. FIG. 21 illustrates a modified embodiment of FIG. 19 having a difference in the structure of a trench. In the following description, redundant descriptions with the embodiment of FIG. 19 are omitted, and only differences are described below.

Referring to FIG. 21, unlike FIG. 19 described above, the depth of each of the first to third trenches ttr1, ttr2, and ttr3 along the thickness direction, for example, ±z directions, of the substrate 100 may be substantially identical. A first depth ddp1' of the first trench ttr1, a second depth ddp2' of the second trench ttr2, and a third depth ddp3' of the third trench ttr3 may be substantially identical. The first to third trenches ttr1, ttr2, and ttr3 may be formed in the buffer layer 111, the first gate insulating layer 113, the second gate insulating layer 115, and the interlayer insulating layer 117.

Furthermore, the thickness of each of the first to third pixel separation films PPSL1, PPSL2, and PPSL3 along the thickness direction, for example, ±z directions, of the substrate 100 may be substantially identical. A first thickness tth1' of the first pixel separation film PPSL1, a second thickness tth2' of the second pixel separation film PPSL2, and a third thickness tth3' of the third pixel separation film PPSL3 may be substantially identical.

A fourth-1 electrode E41 disposed on the second insulating layer IIL2 may connect the third electrodes E3 adjacent to each other, a fourth-2 electrode E42 may connect the first electrodes E1 adjacent to each other, and a fourth-3 electrode E43 may connect the second electrodes E2 adjacent to each other.

Figure 22:
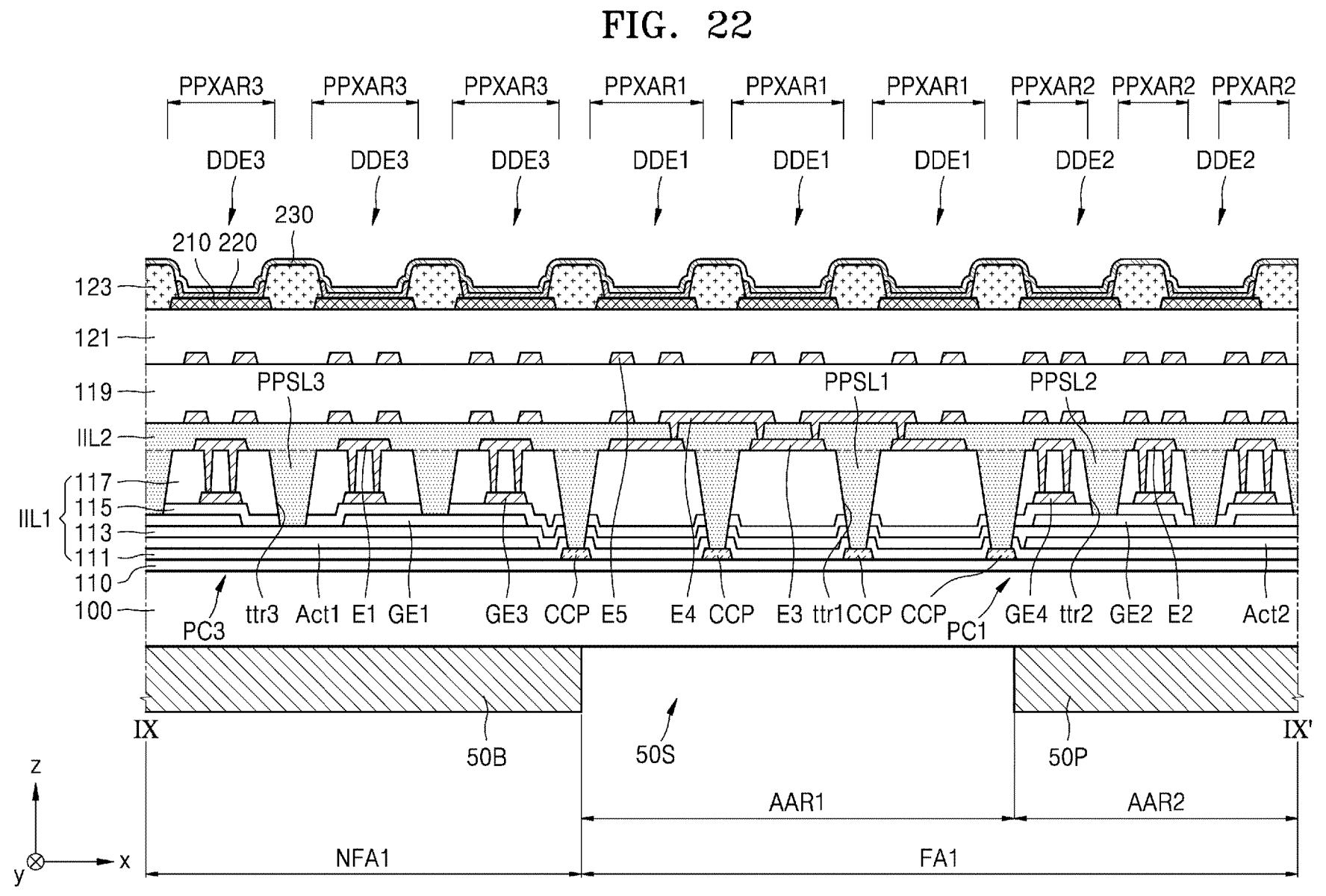

FIG. 22 is yet another exemplary cross-sectional view of a portion of the display apparatus 11 of FIG. 18 taken along line IX-IX'. FIG. 22 illustrates a modified embodiment of FIG. 19 having a difference in the structure of a conductive pattern. In the following description, redundant descriptions with the embodiment of FIG. 19 are omitted, and only differences are described below.

Referring to FIG. 22, the display panel 10 may include conductive patterns CCP. The conductive patterns CCP may be provided between the substrate 100 and the first pixel separation films PPSL1, and may contact the first pixel separation films PPSL1, respectively. The conductive patterns CCP may include a conductive material including Mo, Al, Cu, Ti, or the like, and may be formed in a single layer or multilayer including the above materials. As an example, the conductive patterns CCP may be a single layer of Mo.

The conductive patterns CCP may assist forming an etching depth to be uniform when etching the first insulating layer IIL1 to form the first trench ttr1. By arranging the conductive patterns CCP between the substrate 100 and the first pixel separation films PPSL1, the first trenches ttr1 with a uniform depth may be formed in the first insulating layer IIL1.

FIG. 23 is another exemplary cross-sectional view of a portion of the display apparatus 11 of FIG. 18 taken along line IX-IX'. FIG. 23 illustrates a modified embodiment of FIG. 19 having a difference in the structure of a conductive pattern. In the following description, redundant descriptions with the embodiment of FIG. 19 are omitted, and only differences are described below.

Referring to FIG. 23, unlike FIG. 19 described above, a first insulating layer IIL1' may include the first gate insulating layer 113, the second gate insulating layer 115, and the interlayer insulating layer 117. The first trench ttr1 may be formed in the first gate insulating layer 113, the second gate insulating layer 115, and the interlayer insulating layer 117.

The display panel 10 may include semiconductor patterns SSCP. The semiconductor patterns SSCP may be provided between the substrate 100 and the first pixel separation films PPSL1, and may contact the first pixel separation films PPSL1, respectively. The semiconductor patterns SSCP may include amorphous silicon or polysilicon. In another embodiment, the semiconductor patterns SSCP may include at least one oxide selected from among In, Ga, Sn, Zr, V, Hf, Cd, Ge, Cr, Ti, Al, Cs, Ce, and Zn.

The semiconductor patterns SSCP may assist forming an etching depth to be uniform when etching the first insulating layer IIL1' to form the first trench ttr1. By arranging the semiconductor patterns SSCP between the substrate 100 and the first pixel separation films PPSL1, the first trenches ttr1 with a uniform depth may be formed in the first insulating layer IIL1'.

Although a display apparatus is mainly described above, the disclosure is not limited thereto. For example, a method of manufacturing the display apparatus described above may belong to the scope of the disclosure.

According to an embodiment of the disclosure described above, a high-resolution display apparatus that is robust and simultaneously flexible against external impacts may be implemented. The scope of the disclosure is not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate in which a first area and a second area are defined, wherein the first area includes a plurality of first pixel areas arranged at a first pitch in a first direction, and the second area includes a plurality of second pixel areas arranged at a second pitch less than the first pitch in the first direction;
   a first insulating layer disposed on the substrate and defining a plurality of first trenches and a plurality of second trenches therein, wherein the plurality of first trenches correspond to boundaries among the plurality of first pixel areas, respectively, and are arranged in the first direction, and the plurality of second trenches correspond to boundaries among the plurality of second pixel areas, respectively, and are arranged in the first direction;

a plurality of first pixel separation films buried in the plurality of first trenches, respectively, and comprising a material different from the first insulating layer; and a plurality of second pixel separation films buried in the plurality of second trenches, respectively, and comprising a material different from the first insulating layer, wherein a folding area including the first area and the second area, and a non-folding area, are further defined in the substrate, the display apparatus further comprising: a support layer disposed below the substrate and comprising a first support portion and a second support portion, wherein the first support portion comprises a slit corresponding to the first area of the folding area and a rib corresponding to the second area of the folding area, and the second support portion corresponds to the non-folding area.

2. The display apparatus of claim 1, wherein a first thickness of each of the plurality of first pixel separation films along a thickness direction of the substrate is greater than a second thickness of each of the plurality of second pixel separation films along the thickness direction of the substrate.

3. The display apparatus of claim 1, wherein the first area and the second area each are provided in plurality, and the plurality of first areas and the plurality of second areas are alternately arranged with each other in the first direction.

4. The display apparatus of claim 1, further comprising:

a plurality of first pixel circuits arranged in some second pixel areas, respectively, among the plurality of second pixel areas;

a plurality of second pixel circuits arranged in some other second pixel areas, respectively, among the plurality of second pixel areas;

a plurality of first display elements arranged in the first area and electrically connected to the plurality of first pixel circuits, respectively; and a plurality of second display elements arranged in the second area and electrically connected to the plurality of second pixel circuits, respectively.

5. The display apparatus of claim 4, wherein a first gap between first display elements neighboring each other in the first direction among the plurality of first display elements is substantially the same as a second gap between second display elements neighboring each other in the first direction among the plurality of second display elements.

6. The display apparatus of claim 1, further comprising a plurality of conductive patterns provided between the substrate and the plurality of first pixel separation films and contacting the plurality of first pixel separation films, respectively.

7. The display apparatus of claim 1, further comprising a plurality of semiconductor patterns provided between the substrate and the plurality of first pixel separation films and contacting the plurality of first pixel separation films, respectively.

8. The display apparatus of claim 1, wherein a first thickness of each of the plurality of first pixel separation films along a thickness direction of the substrate is substantially the same as a second thickness of each of the plurality of second pixel separation films along the thickness direction of the substrate.

9. The display apparatus of claim 1, further comprising:

a plurality of first pixel circuits arranged in the plurality of first pixel areas, respectively;

a plurality of second pixel circuits arranged in the plurality of second pixel areas, respectively;

a plurality of first display elements arranged in the first area and electrically connected to the plurality of first pixel circuits, respectively; and a plurality of second display elements arranged in the second area and electrically connected to the plurality of second pixel circuits, respectively, wherein a first gap between first display elements neighboring each other in the first direction among the plurality of first display elements is substantially the same as a second gap between second display elements neighboring each other in the first direction among the plurality of second display elements.

10. The display apparatus of claim 1, wherein the non-folding area comprises a plurality of third pixel areas arranged in the first direction at a third pitch that is substantially the same as the first pitch, and the first insulating layer further defines a plurality of third trenches therein corresponding to boundaries among the plurality of third pixel areas, respectively, and arranged in the first direction, the display apparatus further comprising a plurality of third pixel separation films buried in the plurality of third trenches, respectively, and comprising a material different from the first insulating layer.

11. The display apparatus of claim 10, wherein a first thickness of each of the plurality of first pixel separation films along a thickness direction of the substrate is greater than each of a second thickness of each of the plurality of second pixel separation films along the thickness direction of the substrate and a third thickness of each of the plurality of third pixel separation films along the thickness direction of the substrate.

12. The display apparatus of claim 10, further comprising:

a plurality of first pixel circuits arranged in some second pixel areas, respectively, among the plurality of second pixel areas;

a plurality of second pixel circuits arranged in some other second pixel areas, respectively, among the plurality of second pixel areas;

a plurality of third pixel circuits arranged in the plurality of third pixel areas, respectively;

a plurality of first display elements arranged in the first area of the folding area and electrically connected to the plurality of first pixel circuits, respectively;

a plurality of second display elements arranged in the second area of the folding area and electrically connected to the plurality of second pixel circuits, respectively; and a plurality of third display elements arranged in the non-folding area and electrically connected to the plurality of third pixel circuits, respectively, wherein a first gap between first display elements neighboring each other in the first direction among the plurality of first display elements is substantially the same as each of a second gap between second display elements neighboring each other in the first direction among the plurality of second display elements and a third gap between third display elements neighboring each other in the first direction among the plurality of third display elements.

13. The display apparatus of claim 1, wherein a first gap between first pixel separation films neighboring each other in the first direction among the plurality of first pixel separation films is greater than a second gap between second pixel separation films neighboring each other in the first direction among the plurality of second pixel separation films.

14. The display apparatus of claim 1, wherein the first insulating layer comprises an inorganic material, and the plurality of first pixel separation films and the plurality of second pixel separation films each comprise an organic material.

15. The display apparatus of claim 1, further comprising:
a conductive layer disposed on the first insulating layer; and
a second insulating layer disposed on the conductive layer and monolithic with the plurality of first pixel separation films and the plurality of second pixel separation films.

16. The display apparatus of claim 1, wherein the plurality of first pixel areas are arranged in a second direction crossing the first direction at a third pitch, and
the plurality of second pixel areas are arranged in the second direction at a fourth pitch that is substantially the same as the third pitch.

17. An electronic device comprising:
a substrate in which a first area including a plurality of first pixel areas and a second area including a plurality of second pixel areas are defined;
an insulating layer disposed on the substrate and defining a plurality of first trenches and a plurality of second trenches therein, wherein the plurality of first trenches at least partially surrounding the plurality of first pixel areas, respectively, and the plurality of second trenches at least partially surrounding the plurality of second pixel areas, respectively;
a plurality of first pixel separation films buried in the plurality of first trenches, respectively, and comprising a material different from the insulating layer; and
a plurality of second pixel separation films buried in the plurality of second trenches, respectively, and comprising a material different from the insulating layer,
wherein a first depth of each of the plurality of first pixel separation films along a thickness direction of the substrate is greater than a second depth of each of the plurality of second pixel separation films along the thickness direction of the substrate,
wherein a folding area including the first area and the second area, and a non-folding area, are further defined in the substrate,
the electronic device further comprising a support layer disposed below the substrate and comprising a first support portion comprising a slit corresponding to the first area of the folding area and a rib corresponding to the second area of the folding area, and a second support portion corresponding to the non-folding area.

18. The electronic device of claim 17, further comprising:
a plurality of first pixel circuits arranged in some second pixel areas, respectively, among the plurality of second pixel areas;
a plurality of second pixel circuits arranged in some other second pixel areas, respectively, among the plurality of second pixel areas;
a plurality of first display elements arranged in the first area and electrically connected to the plurality of first pixel circuits, respectively; and
a plurality of second display elements arranged in the second area and electrically connected to the plurality of second pixel circuits, respectively.

19. The electronic device of claim 18, wherein a first gap between first display elements neighboring each other among the plurality of first display elements is substantially the same as a second gap between second display elements neighboring each other among the second display elements.

20. The electronic device of claim 17, further comprising
a plurality of conductive patterns or a plurality of semi-conductor patterns provided between the substrate and the plurality of first pixel separation films and contacting the plurality of first pixel separation films, respectively.

21. The electronic device of claim 17, wherein the first area and the second area each are provided in plurality, and
the plurality of first areas and the plurality of second areas are alternately arranged with each other in one direction.

22. The electronic device of claim 17, wherein the non-folding area comprises a plurality of third pixel areas, and
the insulating layer further defines a plurality of third trenches at least partially surrounding the plurality of third pixel areas, respectively,
the electronic device further comprising a plurality of third pixel separation films buried in the plurality of third trenches, respectively, and comprising a material different from the insulating layer,
wherein the first depth of each of the plurality of first pixel separation films is greater than a third depth of each of the plurality of third pixel separation films along the thickness direction of the substrate.

23. The electronic device of claim 17, wherein the insulating layer comprises an inorganic material, and the plurality of first pixel separation films and the plurality of second pixel separation films each comprise an organic material.

* * * * *